US012764955B2

(12) United States Patent
Kong et al.

(10) Patent No.: US 12,764,955 B2
(45) Date of Patent: Oct. 13, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Cuicui Kong, Wuhan (CN); Kun Zhang, Wuhan (CN); Yuhui Han, Wuhan (CN); Linchun Wu, Wuhan (CN); Shuangshuang Wu, Wuhan (CN); Zhiliang Xia, Wuhan (CN); Zongliang Huo, Wuhan (CN); Jingtao Xie, Wuhan (CN); Bingjie Yan, Wuhan (CN); Di Wang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 767 days.

(21) Appl. No.: 18/091,000

(22) Filed: Dec. 29, 2022

(65) Prior Publication Data

US 2024/0188292 A1 Jun. 6, 2024

(51) Int. Cl.

| | |
|---|---|
| *H10B 43/10* | (2023.01) |
| *H10B 41/10* | (2023.01) |
| *H10B 41/27* | (2023.01) |
| *H10B 43/27* | (2023.01) |

(52) U.S. Cl.

CPC ............ *H10B 43/27* (2023.02); *H10B 41/27* (2023.02)

(58) Field of Classification Search

None

See application file for complete search history.

(56) References Cited

U.S. PATENT DOCUMENTS

| | | | | |
|---|---|---|---|---|
| 10,262,936 | B2 * | 4/2019 | Yazawa ............... | H10W 20/083 |
| 2021/0143100 | A1 * | 5/2021 | Chakravarthi .... | H01L 21/76805 |

* cited by examiner

*Primary Examiner* — Sarah K Salerno

(74) *Attorney, Agent, or Firm* — BAYES PLLC

(57) ABSTRACT

In certain aspects, a three-dimensional (3D) memory device includes channel structures in a first region, word line pick-up structures in a second region, and word lines each extending from the first region into at least a portion of the second region. At least one word line pick-up structure includes multiple sections each electrically connected to a different word line.

19 Claims, 26 Drawing Sheets

107

900

906

THREE-DIMENSIONAL MEMORY DEVICES AND METHODS FOR FORMING THE SAME

CROSS-REFERENCE TO RELATED APPLICATIONS

This application claims the benefit of priority to Chinese Application No. 202211544701.2, filed Dec. 2, 2022, which is incorporated herein by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a 3D memory device includes channel structures in a first region, word line pick-up structures in a second region, and word lines each extending from the first region into at least a portion of the second region. At least one word line pick-up structure includes multiple sections each electrically connected to a different word line.

In some implementations, the multiple sections of the at least one word line pick-up structure are electrically insulated from each other.

In some implementations, the multiple sections of the at least one word line pick-up structure are separated from each other by one or more slit structures.

In some implementations, at least one of the one or more slit structures extends from the second region into the first region.

In some implementations, at least one of the one or more slit structures extends within the second region without reaching into the first region.

In some implementations, the one or more slit structures include first and second slit structures that are perpendicular to each other.

In some implementations, the one or more slit structures include first and second slit structures that are parallel to each other.

In some implementations, the at least one word line pick-up structure includes first and second sections electrically connected to first and second word lines, respectively. The first and second word lines are separated from each other by a dielectric layer.

In some implementations, the at least one word line pick-up structure includes first and second word line pick-up structures. The first word line pick-up structure is closer to the first region than the second word line pick-up structure. The first word line pick-up structure includes a first plurality of sections electrically connected to a first plurality of word lines, respectively. The second word line pick-up structure includes a second plurality of sections electrically connected to a second plurality of word lines, respectively. Each of the first plurality of word lines is located in higher layers measured from a substrate of the 3D memory device than any of the second plurality of the word lines.

In some implementations, each of the sections of the at least one word line pick-up structure includes a vertical contact and an interconnect line in contact with the vertical contact and the corresponding word line.

In some implementations, the interconnect line is sandwiched between two dielectric layers in the second region.

In some implementations, each of the sections of the at least one word line pick-up structure further includes a spacer at least partially circumscribing the vertical contact.

In some implementations, each of the sections of the at least one word line pick-up structure further includes a filler at least partially circumscribed by the vertical contact.

In some implementations, each of the channel structures includes a memory layer and a channel layer.

In another aspect, a method for forming a 3D memory device includes forming a stack structure including interleaved first dielectric layers and second dielectric layers. The first dielectric layers include a first dielectric material and the second dielectric layers include a second dielectric material. The method also includes forming channel structures extending through the first dielectric layers and the second dielectric layers in a first region of the stack structure. The method also includes forming word line pick-up structures extending through the first dielectric layers and the second dielectric layers in a second region of the stack structure. At least one word line pick-up structure includes multiple sections each reaching different depths in the second region of the stack structure.

In some implementations, forming the word line pick-up structures includes forming, in a first word line pick-up zone in the second region of the stack structure, a first staircase comprising a first division and a second division that is lower than the first division; and chopping, in the first word line pick-up zone, the first staircase to a first depth.

In some implementations, forming the word line pick-up structures further includes forming, in a second word line pick-up zone in the second region of the stack structure, a second staircase; and chopping, in the second word line pick-up zone, the second staircase to a second depth that is different than the first depth.

In some implementations, a first lateral distance between the first word line pick-up zone and the first region is shorter than a second lateral distance between the second word line pick-up zone and the first region. The second depth is deeper than the first depth.

In some implementations, forming the word line pick-up structures further includes forming a spacer in the first word line pick-up zone; and punching the spacer to expose the second dielectric layers corresponding to the first and second divisions, respectively.

In some implementations, forming the word line pick-up structures further includes depositing a layer of second dielectric material onto the spacer and the exposed second dielectric layers corresponding to the first and second divisions, respectively. After depositing the layer of second dielectric material, filling the first word line pick-up zone with the first dielectric material.

In some implementations, forming the word line pick-up structures further includes forming a slit in the filled first word line pick-up zone. The slit extends through a joint region between the first and second divisions to separate remainders of the first and second divisions.

In some implementations, forming the word line pick-up structures further includes replacing all of the second dielectric layers in the first region with conductive layers; and replacing, through the slit, part of the second dielectric layers in the second region with conductive layers.

In some implementations, forming the word line pick-up structures further includes after replacing part of the second dielectric layers in the second region with conductive layers, filling the slit with the first dielectric material.

In some implementations, the method further includes replacing remainders of the second dielectric layers on the spacer with conductive layers to form the multiple sections of the at least one word line pick-up structure, such that each of the multiple sections of the at least one word line pick-up structure is electrically connected to a different word line.

In yet another aspect, a system includes a 3D memory device configured to store data. The 3D memory device includes channel structures in a first region, word line pick-up structures in a second region, and word lines each extending from the first region into at least a portion of the second region. At least one word line pick-up structure includes multiple sections each electrically connected to a different word line. The system also includes a memory controller electrically connected to the 3D memory device and configured to operate the channel structures through the word lines.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
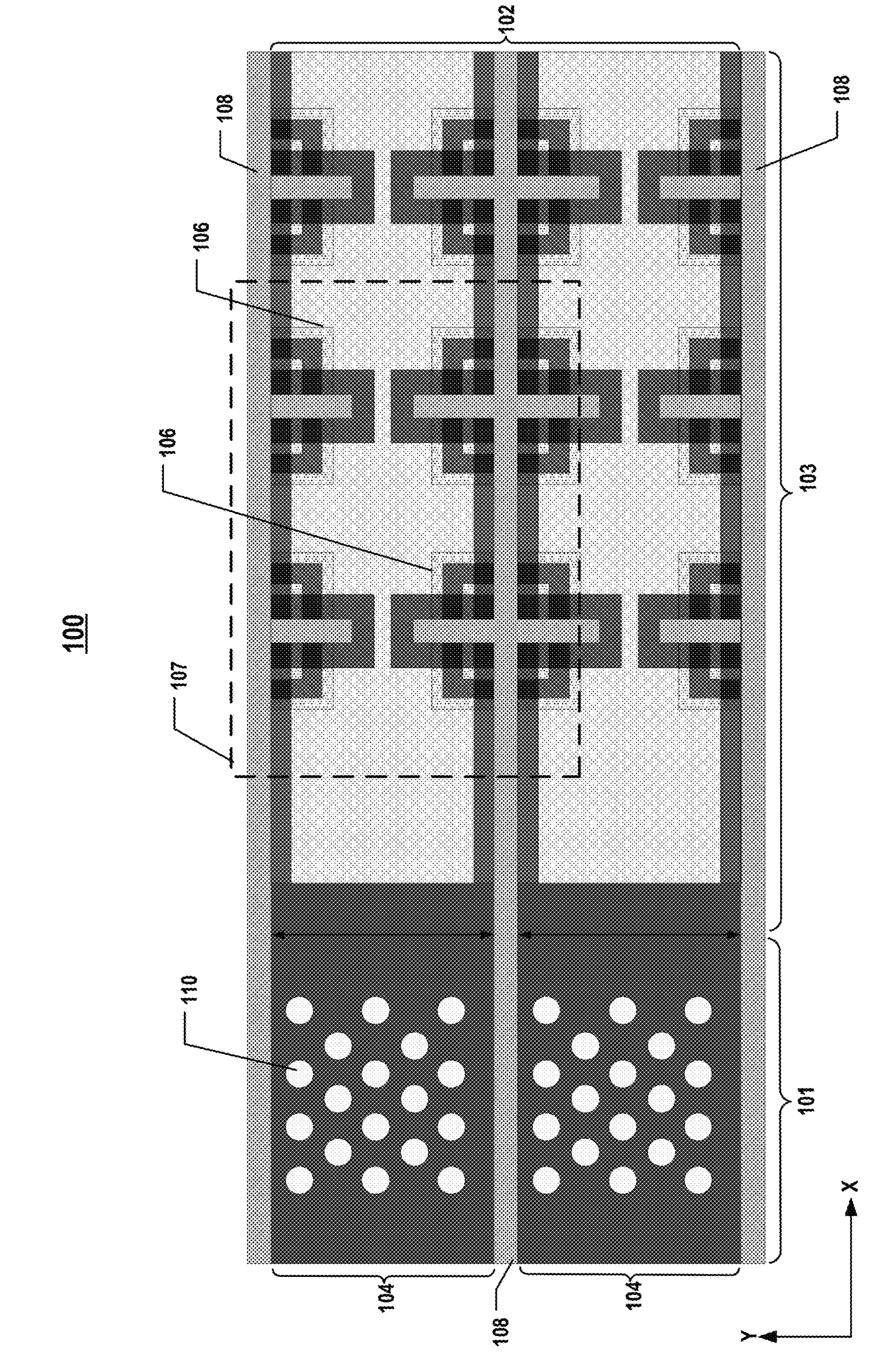
FIG. 1 illustrates a plan view of a 3D memory device having multi-sectional word line pick-up structures, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical contacts are formed) and one or more dielectric layers.

In some 3D memory devices, such as 3D NAND memory devices, memory cells for storing data are vertically stacked through a stack structure (e.g., a memory stack) in vertical channel structures. 3D memory devices usually include staircase structures formed on one or more sides (edges), or at the center, of the stacked storage structure for purposes such as word line pick-up/fan-out using word line contacts landed onto different steps/levels of a staircase structure. Dummy channel structures are usually formed through the memory stack in regions outside of the core array region in which the channel structures of 3D NAND memory devices are formed, such as staircase regions having the staircase structures, to provide mechanical support to the stack structure, in particular, during the gate replacement process that temporarily removes some layers of the stack structure through slit openings across the core array region and staircase regions of the stack structure.

The integration of the various structures, such as dummy channel structures, word lien contacts, staircase structures, slit openings, etc., from both the device design perspective and the fabrication process perspective, has become more and more challenging as the memory cell density of the 3D NAND memory devices continues increasing. For example, making staircase structures and word line contacts normally involves multiple complicated processes. To simplify the process, one solution has been proposed to achieve the word line pick-up/fan-out functions without using staircase structures and word line contacts. Instead, the two structures-staircase structure and word line contact, as well as their separate processes, can be merged into a single word line pick-up structure in one process, thereby reducing the manufacturing cost and simplifying the process. Moreover, by replacing staircase structures and word line contacts with word line pick-up structures, the scope of the gate replacement process can be reduced, such that at least some of the dummy channel structures can be eliminated as well to further reduce the cost and simplify the process.

Using word line pick-up structures, however, brings new challenges. For example, to ensure etching accuracy, the size of a word line pick-up structure normally needs to be kept relatively large. Because each word line pick-up structure only connects to one word line, the number of word line pick-up structures is equal to the number of word lines. For memory devices having a large number of word lines, a large portion of the device real estate has to be devoted to word line pick-up structures to accommodate the equally large number of word line pick-up structures, making further increase of the memory cell density difficult.

To address one or more of the aforementioned issues, the present disclosure introduces a solution that divides a single word line pick-up structure into multiple sections such that each section connects to a different word line. In this way, the total number of word line pick-up structures can be reduced to half, one third, one fourth, or even less.

FIG. 1 illustrates a plan view of a 3D memory device 100 having multi-sectional word line pick-up structures 106 (also referred to as word line pick-up structures 106 for simplicity), according to some aspects of the present disclosure. In some implementations, 3D memory device 100 is a NAND Flash memory device in which memory cells are provided in the form of an array of NAND memory strings. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100.

As shown in FIG. 1, 3D memory device 100 can include one or more blocks 102 arranged in the y-direction (the bit line direction) separated by parallel slit structures 108, such as gate line slits (GLSs). In some implementations in which 3D memory device 100 is a NAND Flash memory device, each block 102 is the smallest erasable unit of the NAND Flash memory device. Each block 102 can further include multiple fingers 104 in the y-direction separated by some of slit structures 108.

As shown in FIG. 1, 3D memory device 100 can be divided into at least a core array region 101 in which an array of channel structures 110 are formed, as well as a word line pick-up region 103 in which word line pick-up structures 106 are formed. Each of the channel structures 110 may include a memory layer and a channel layer. Core array region 101 and word line pick-up region 103 are arranged in the x-direction (the word line direction), according to some implementations. It is understood that although one core array region 101 and one word line pick-up region 103 are illustrated in FIG. 1, multiple core array regions 101 and/or multiple word line pick-up regions 103 may be included in 3D memory device 100, for example, one word line pick-up region 103 between two core array regions 101 in the x-direction, in other examples. It is also understood that FIG. 1 only illustrates portions of core array region 101 that are adjacent to word line pick-up region 103.

Figure 2:
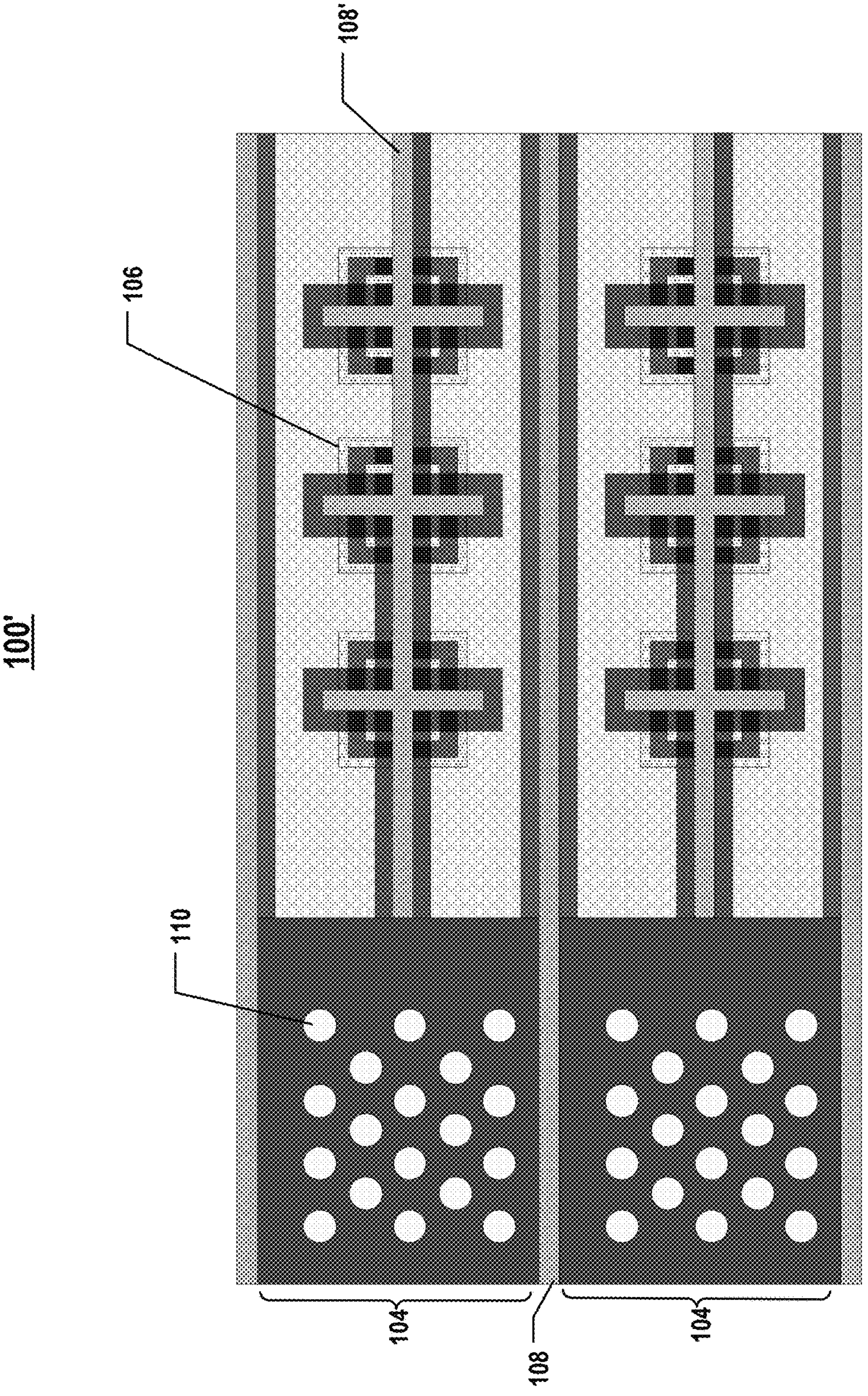
FIG. 2 illustrates a plan view of another 3D memory device having multi-sectional word line pick-up structures, according to some aspects of the present disclosure.

As shown in FIG. 1, word line pick-up structures 106 are arranged along slit structures 108. In some embodiments, slit structure 108 may extend from word line pick-up region 103 into core array region 101. It is understood that the layout and arrangement of word line pick-up structures 106, as well as the shape of each word line pick-up structure 106, may vary in different examples. For example, FIG. 2 illustrates another exemplary 3D memory device 100' in which each finger 104 includes one row of word line pick-up structures 106. As shown in FIG. 2, some slit structures 108' may extend within word line pick-up region 103 without reaching into core array region 101. Word line pick-up structures 106 may be arranged along slit structures 108'.

Figure 3:
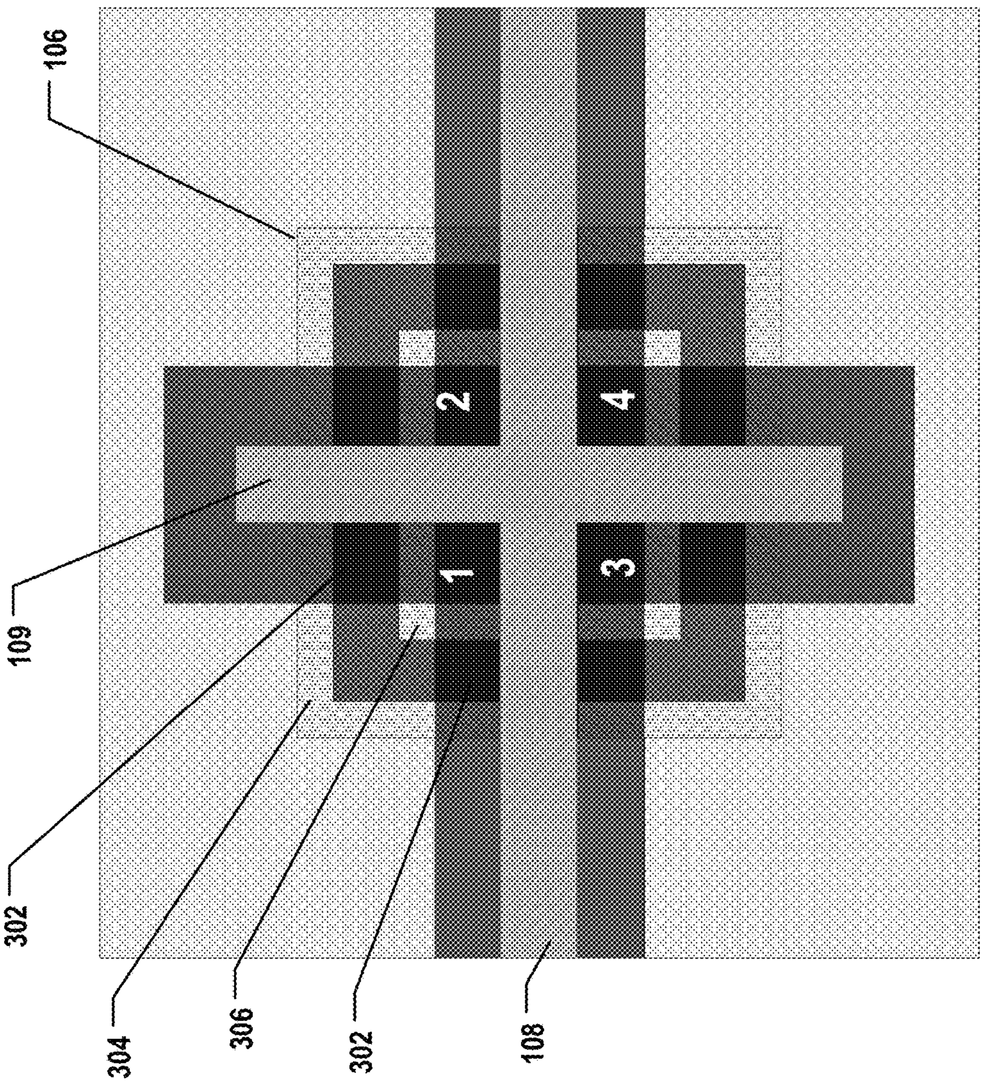
FIG. 3 illustrates a plan view of a single word line pick-up structure 106 shown in FIG. 1, according to some aspects of the present disclosure.

FIG. 3 illustrates a plan view of a single word line pick-up structure 106 shown in FIG. 1, according to some aspects of the present disclosure. As shown in FIG. 3, word line pick-up structure 106 includes four sections (1, 2, 3, 4) that are divided by slit structures 108 and 109. Although FIG. 3 shows that slit structures 108 and 109 are perpendicular to each other and equally divide word line pick-up structure 106 into four sections, other manners of arrangement or division of sections can be used. Slit structures 108 and 109 may include dielectric materials including, but not limited to, silicon oxide, silicon nitride, silicon oxynitride, or any combination thereof, and function as insulation layers to electrically insulate the four sections. In the embodiment shown in FIG. 3, each section may have a similar structure. Take section 1 for example, one or more vertical contact 302 may extend to a certain depth in the word line pick-up region and electrically connect to a word line (e.g., through an interconnect line). A contact spacer 304 may partially circumscribe vertical contact 302 (or may entirely circumscribe vertical contact 302 together with slit structures 108 and 109). Contact spacer 304 may include dielectric materials including, but not limited to, silicon oxide, silicon nitride, silicon oxynitride, or any combination thereof, and function as an insulation layer to electrically insulate vertical contact 302 from other word lines except the one connected to vertical contact 302. Section 1 may also include a filler 306, which may be partially circumscribed by vertical contact 302 (or may be entirely circumscribed by vertical contact 302 together with slit structures 108 and 109). Filler 306 may include dielectric materials, including, but not limited to, silicon oxide, silicon nitride, silicon oxynitride, or any combination thereof.

Each section 1, 2, 3, or 4 of word line pick-up structure 106 may be electrically connected to a different word line. That is, the vertical contacts (e.g., vertical contact 302) of these sections may extend to different depths and electrically connect to different word lines at different depths. In this way, word line pick-up structure 106 can pick up/fan out four word lines instead of just one word line thanks to the four individual sections. In some embodiments, the four word lines may be adjacent to one another (e.g., two adjacent word lines may be separated by only one dielectric layer). For example, section 1 may reach the Nth layer word line, section 2 may reach the (N+1)th layer word line, section 3 may reach the (N+2)th layer word line, and section 4 may reach the (N+3)th layer word line. The manner of connecting sections of word line pick-up structure 106 with different word lines is not limited to this example. Any suitable way of establishing electrical connections may be used.

Figure 4:
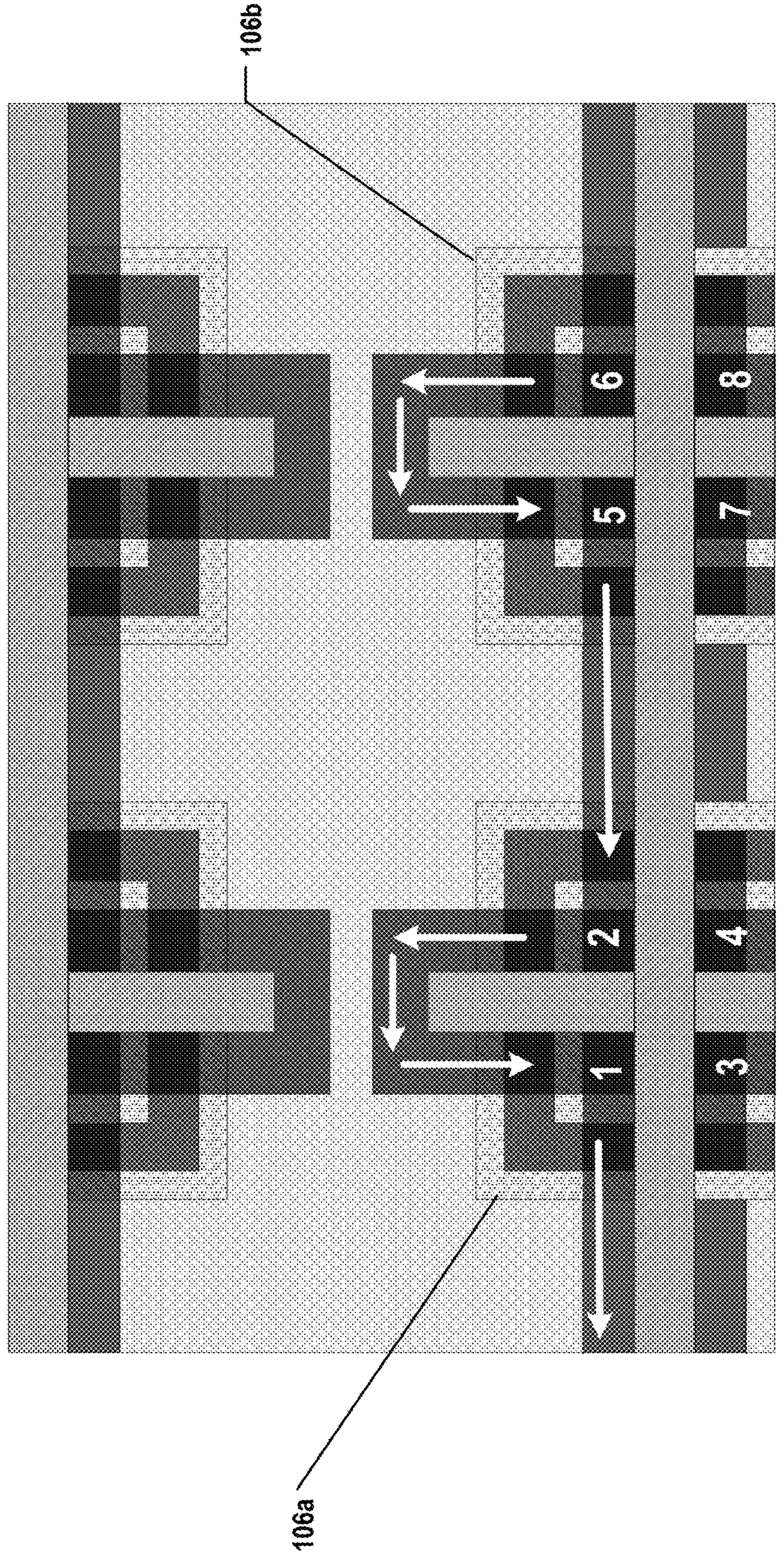
FIG. 4 illustrates an enlarged view of the 3D memory device having multi-sectional word line pick-up structures shown in FIG. 1, according to some aspects of the present disclosure.

FIG. 4 illustrates an enlarged area 107 shown in FIG. 1. FIG. 4 shows an exemplary manner of conducting electrical current from a section of a word line pick-up structure to core array region 101 (to the left of area 107, not shown). As shown in FIG. 4, two adjacent word line pick-up structures 106*a* and 106*b* may each include four sections 1-4 and 5-8, respectively. Electrical current may flow from, for example, section 6 to core array region 101 along the path shown in FIG. 4. Note that the arrows showing the path are at the depth of the word line corresponding to section 6. To allow the electrical current to pass across word line pick-up structures 106*a*, sections 1-4 may connect to word lines that are higher/shallower than the word line corresponding to section 6, such that the word line corresponding to section 6 passes uninterrupted beneath word line pick-up structures 106*a* rather than being cut off by word line pick-up structures 106*a*. Similarly, word line pick-up structures located farther away (e.g., to the right) from core array region 101 may reach even deeper word lines than word line pick-up structure 106*b* in order to establish electrical current passage across both word line pick-up structures 106*a* and 106*b*. In other words, word line pick-up structures located closer to core array region 101 may connect to higher/shallower word lines, while word line pick-up structures located farther away from core array region 101 may connect to lower/deeper word lines.

Figure 5:
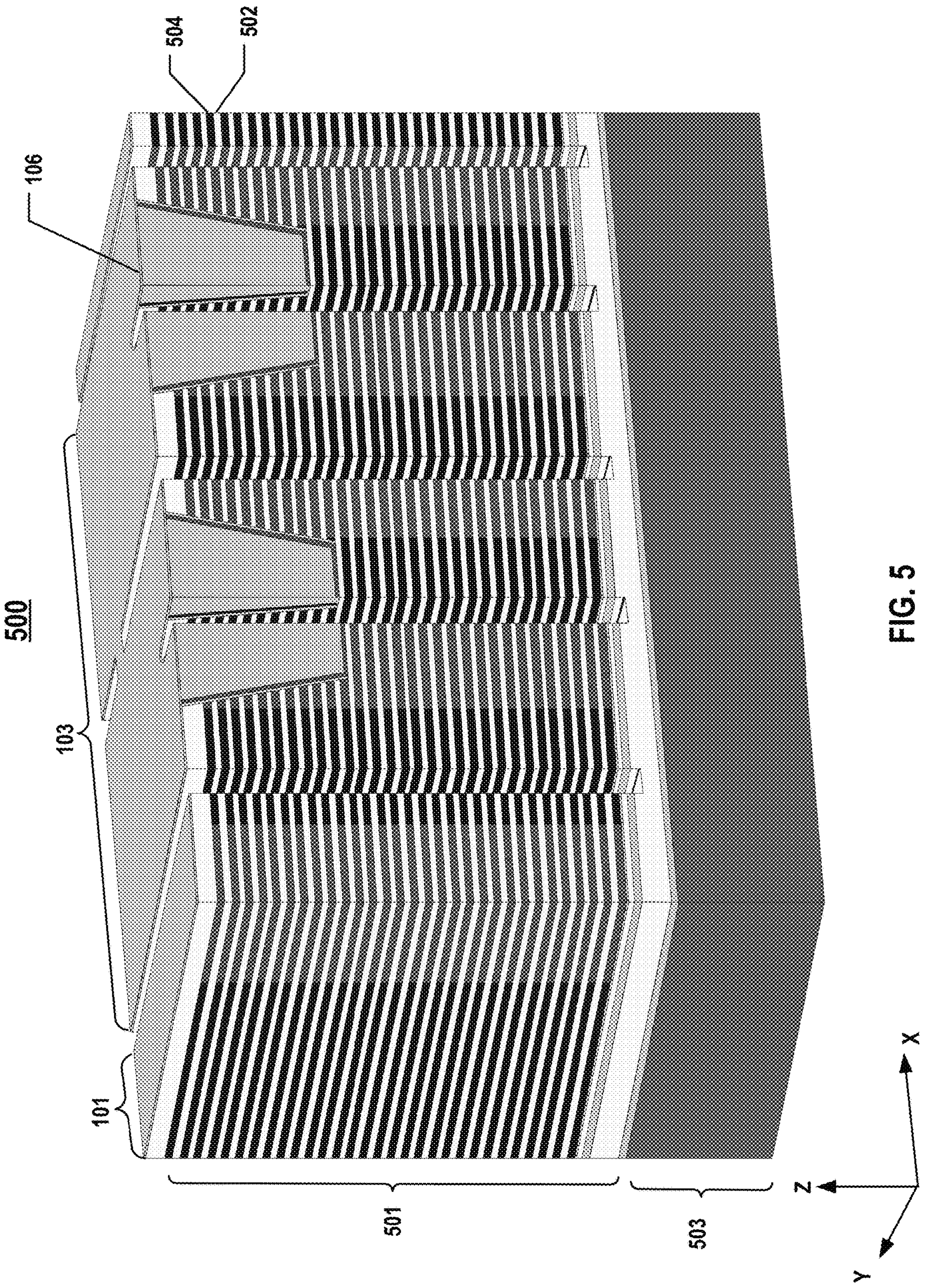
FIG. 5 illustrates a perspective view of a 3D memory device having word line pick-up structures with multiple sections, according to some aspects of the present disclosure.
Figure 6:
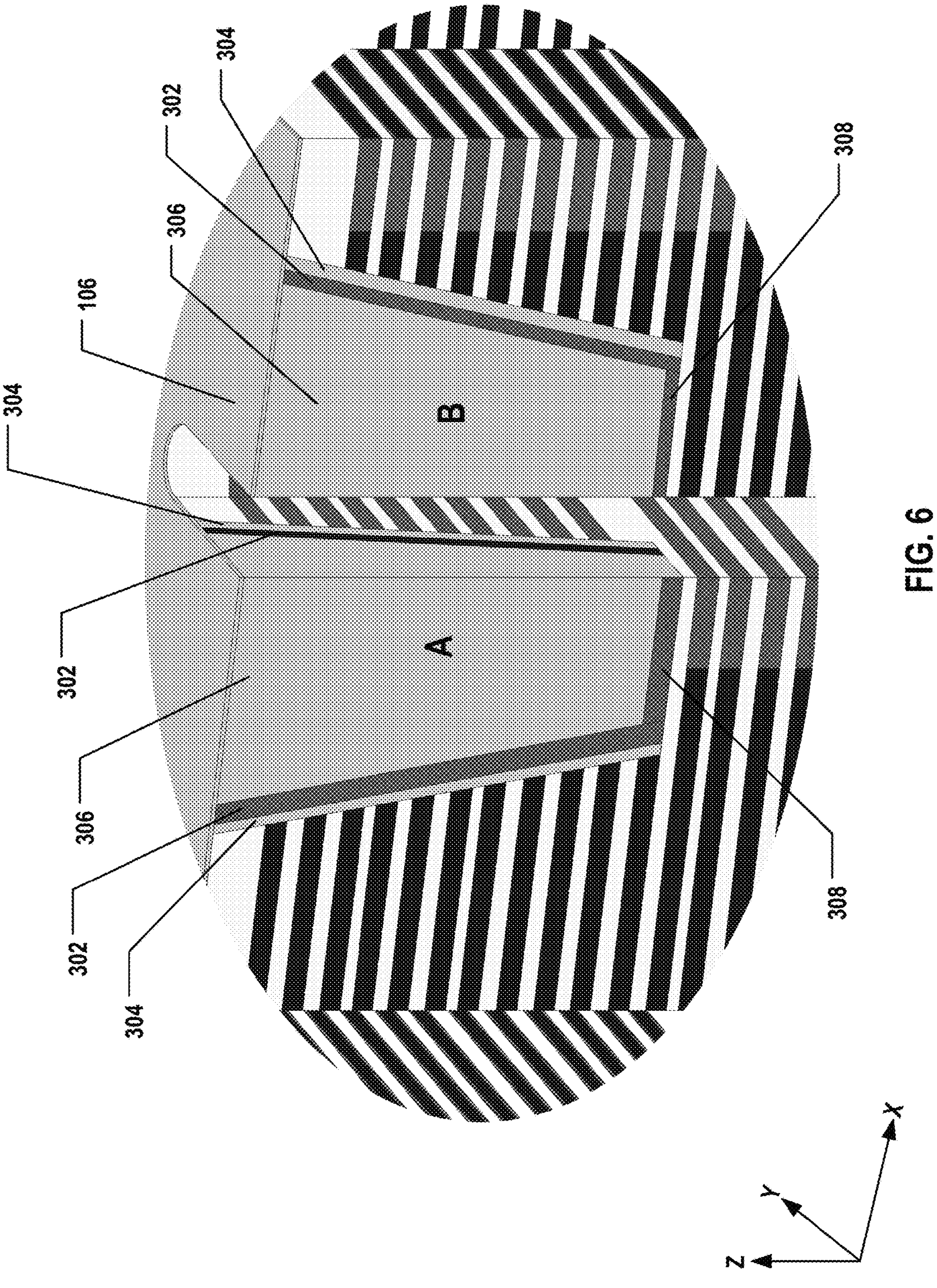
FIG. 6 illustrates an enlarged perspective view of the 3D memory device shown in FIG. 5, according to some aspects of the present disclosure.

FIG. 5 illustrates a perspective view of a 3D memory device 500 having word line pick-up structures 106 with multiple sections, according to some aspects of the present disclosure. It is noted that 3D memory device 500 is a simplified version of 3D memory device 100, showing only two word line pick-up structures for clarity purposes, but otherwise, they share the same features. FIG. 6 illustrates an enlarged perspective view of 3D memory device 500 having word line pick-up structures 106 with multiple sections, according to some aspects of the present disclosure. As shown in FIGS. 5 and 6, a stack structure 501 can be formed on a substrate 503, which can include silicon (e.g., single crystalline silicon), silicon germanium (SiGe), gallium arsenide (GaAs), germanium (Ge), silicon on insulator (SOI), or any other suitable materials. In some implementations, substrate 503 includes single crystalline silicon, which is part of the wafer on which 3D memory device 500 is fabricated, either in its native thickness or being thinned. In some implementations, substrate 503 includes, for example, polysilicon, which is a semiconductor layer replacing the part of the wafer on which 3D memory device 500 is fabricated. It is noted that x, y, and z axes are included in FIGS. 5 and 6 to further illustrate the spatial relationship of the components in 3D memory device 500. Substrate 503 of 3D memory device 500 includes two lateral surfaces extending laterally in the x-y plane: a top surface on the front side of the wafer on which stack structure 501 can be formed, and a bottom surface on the backside opposite to the front side of the wafer. The z-axis is perpendicular to both the x and y axes. As used herein, whether one component (e.g., a layer or a device) is "on," "above," or "below" another component, or is "higher/shallower" or "lower/deeper" than another component (e.g., a layer or a device) of 3D memory device 500 is determined relative to substrate 503 of 3D memory device 500 in the z-direction (the vertical direction perpendicular to the x-y plane) when substrate 503 is positioned in the lowest plane of 3D memory device 500 in the z-direction. The same notion for describing the spatial relationship is applied throughout the present disclosure.

As shown in FIG. 5, stack structure 501 can include vertically interleaved first material layers 502 and second material layers 504 that are different from first material layers 502. First material layers 502 and second material layers 504 can alternate in the vertical direction (the z-direction). In some implementations, stack structure 501 can include a plurality of material layer pairs stacked vertically in the z-direction, each of which includes first material layer 502 and second material layer 504. The number of the material layer pairs in stack structure 501 can determine the number of memory cells in 3D memory device 500.

In some implementations, 3D memory device 500 is a NAND Flash memory device, and stack structure 501 is a stacked storage structure through which NAND memory strings are formed. In some implementations, core array region 101 includes a conductive stack structure having interleaved conductive layers and first dielectric layers. That is, second material layers 504 of stack structure 501 may be conductive layers in core array region 101. In some implementations, word line pick-up region 103 also includes a conductive stack structure having interleaved conductive layers and first dielectric layers. That is, second material layers 504 of stack structure 501 may also be conductive layers in word line pick-up region 103. First material layers 502 of stack structure may be the first dielectric layers in both conductive stack structures of core array region 101 and word line pick-up region 103.

In some implementations, each conductive layer in the conductive stack structure in core array region 101 and word line pick-up region 103 functions as a gate line of the NAND memory strings (in the forms of channel structures 110) in core array region 101, as well as a word line extending laterally from the gate line and ending in word line pick-up region 103 for word line pick-up/fan-out through word line pick-up structures 106. The word lines (i.e., the conductive layers) at different depths/level of the conductive stack structure each extends laterally in core array region 101 and word line pick-up region 103 (except where the word lines are cut off by word line pick-up structures 106), according to some implementations.

The conductive layers can include conductive materials including, but not limited to, tungsten (W), cobalt (Co), copper (Cu), aluminum (Al), titanium nitride (TiN), polycrystalline silicon (polysilicon), doped silicon, silicides, or any combination thereof. The dielectric layers can include dielectric materials including, but not limited to, silicon oxide, silicon nitride, silicon oxynitride, or any combination thereof. The first dielectric layers may include silicon oxide. In some implementations, the conductive layers include metals, such as tungsten, the first dielectric layers include silicon oxide. For example, first material layers 502 of stack structure 501 may include silicon oxide across core array region 101 and word line pick-up region 103, and second material layers 504 of stack structure 501 may include tungsten in core array region 101 and word line pick-up region 103.

As shown in FIG. 5, the heights of stack structure 501 are uniform in core array region 101 and in word line pick-up region 103, according to some implementations. Different from some 3D memory devices that include one or more staircase structures in a staircase region (corresponding to word line pick-up region 103 for word line pick-up/fan-out), which has ununiform heights of the stack structure in the staircase region, 3D memory device 500 can eliminate the staircase structures while still achieving the word line pick-up/fan-out function using word line pick-up structures 106, as described below in detail.

As shown in FIG. 6, word line pick-up structures 106 extend vertically into stack structure 501 in word line pick-up region 103. Different sections A and B are at different depths in the z-direction, according to some implementations. The top surfaces of different sections of word line pick-up structures 106 can be flush with one another, while the bottom surfaces of different sections of word line pick-up structures 106 can extend to different levels, for example, different second material layers 504 of stack structure 501.

As shown in FIG. 6, in some implementations, each section (e.g., A or B) of word line pick-up structure 106 includes a vertical contact 302, a contact spacer 304 at least partially circumscribing vertical contact 302, and an interconnect line 308 below and in contact with vertical contact 302. Vertical contact 302 and interconnect line 308 can include conductive materials including, but not limited to, W, Co, Cu, Al, TiN, polysilicon, doped silicon, silicides, or any combination thereof. Contact spacer 304 can include dielectric materials including, but not limited to, silicon oxide, silicon nitride, silicon oxynitride, or any combination thereof. In some implementations, vertical contact 302 and interconnect line 308 include TiN/W, and contact spacer 304 includes silicon oxide. As shown in FIG. 6, interconnect line 308 may be sandwiched between two first material layers 502 (e.g., dielectric layers).

It is noted that for clarity purposes, slit structures 108 is omitted in FIGS. 5 and 6. Instead, the space where slit structures 108 occupy is left empty to show the stack structure behind slit structures 108. As shown in FIGS. 5 and 6, different sections of word line pick-up structures 106 are separated from each other by slit structures 108. Different sections of word line pick-up structures 106 may also be electrically insulated from each other. For example, slit structures 108 may include dielectric materials to provide electrical insulation.

Figure 13:
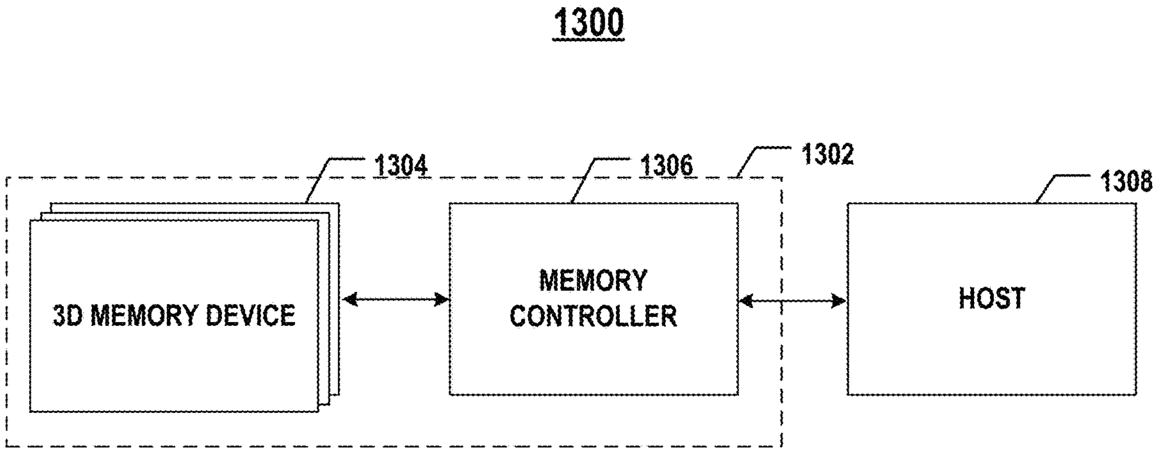
FIG. 13 illustrates a block diagram of an exemplary system having a 3D memory device, according to some aspects of the present disclosure.

FIG. 13 illustrates a block diagram of an exemplary system 1300 having a 3D memory device, according to some aspects of the present disclosure. System 1300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 13, system 1300 can include a host 1308 and a memory system 1302 having one or more 3D memory devices 1304 and a memory controller 1306. Host 1308 can be a processor of an electronic device, such as a central processing unit (CPU), or a system-on-chip (SoC), such as an application processor (AP). Host 1308 can be configured to send or receive data to or from 3D memory devices 1304.

3D memory device 1304 can be any 3D memory device disclosed herein. In some implementations, each 3D memory device 1304 includes a NAND Flash memory. Consistent with the scope of the present disclosure, word line pick-up structures can replace the staircase structures and word line contacts to achieve word line pick-up/fan-out functions, thereby reducing the manufacturing cost and simplifying the fabrication process.

Memory controller 1306 (a.k.a., a controller circuit) is coupled to 3D memory device 1304 and host 1308 and is configured to control 3D memory device 1304, according to some implementations. For example, memory controller 1306 may be configured to operate the plurality of channel structures via the word lines. Memory controller 1306 can manage the data stored in 3D memory device 1304 and communicate with host 1308. In some implementations, memory controller 1306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1306 can be configured to control operations of 3D memory device 1304, such as read, erase, and program operations. Memory controller 1306 can also be configured to manage various functions with respect to the data stored or to be stored in 3D memory device 1304 including, but not limited to bad-block management, garbage collection, logical-to-physical address conversion, wear leveling, etc. In some implementations, memory controller 1306 is further configured to process error correction codes (ECCs) with respect to the data read from or written to 3D memory device 1304. Any other suitable functions may be performed by memory controller 1306 as well, for example, formatting 3D memory device 1304. Memory controller 1306 can communicate with an external device (e.g., host 1308) according to a particular communication protocol. For example, memory controller 1306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 14A:
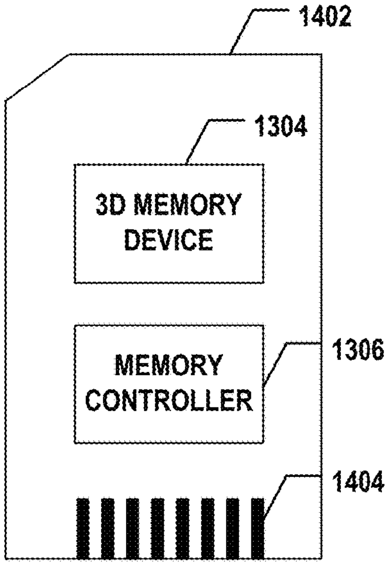
FIG. 14A illustrates a diagram of an exemplary memory card having a 3D memory device, according to some aspects of the present disclosure.
Figure 14B:
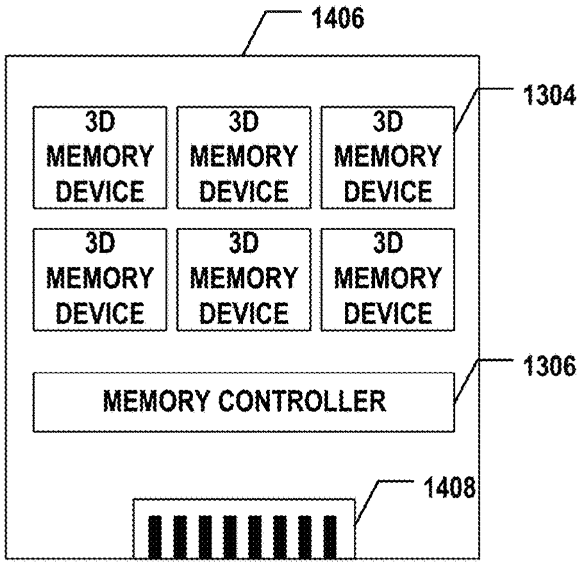
FIG. 14B illustrates a diagram of an exemplary solid-state drive (SSD) having a 3D memory device, according to some aspects of the present disclosure.

Memory controller 1306 and one or more 3D memory devices 1304 can be integrated into various types of storage devices, for example, be included in the same package, such as a universal Flash storage (UFS) package or an eMMC package. That is, memory system 1302 can be implemented and packaged into different types of end electronic products. In one example as shown in FIG. 14A, memory controller 1306 and a single 3D memory device 1304 may be integrated into a memory card 1402. Memory card 1402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1402 can further include a memory card connector 1404 electrically coupling memory card 1402 with a host (e.g., host 1308 in FIG. 13). In another example as shown in FIG. 14B, memory controller 1306 and multiple 3D memory devices 1304 may be integrated into an SSD 1406. SSD 1406 can further include an SSD connector 1408 electrically coupling SSD 1406 with a host (e.g., host 1308 in FIG. 13). In some implementations, the storage capacity and/or the operation speed of SSD 1406 is greater than those of memory card 1402.

FIGS. 7A-7J and FIGS. 8A-8H illustrate a fabrication process for forming a 3D memory device having multi-sectional word line pick-up structures, according to some aspects of the present disclosure. FIG. 9A illustrates a flowchart of a method 900 for forming an exemplary 3D memory device having multi-sectional word line pick-up structures, according to some implementations of the present disclosure. FIGS. 9B and 9C illustrate a flowchart of an exemplary implementation of an operation of method 900. Examples of the 3D memory device depicted in FIGS. 7A-7J, 8A-8H, and 9A-9C include 3D memory devices 100 depicted in FIGS. 1, 3, and 4; 100' depicted in FIG. 2; and 500 depicted in FIGS. 5 and 6. FIGS. 7A-7J, 8A-8H, and 9A-9C will be described together. It is understood that the operations shown in method 900 are not exhaustive and that other operations can be performed as well before, after, or between any of the illustrated operations. Further, some of the operations may be performed simultaneously, or in a different order than shown in FIGS. 9A-9C.

Referring to FIG. 9A, method 900 starts at operation 902, in which a stack structure including interleaved first dielectric layers and second dielectric layers is formed. The first dielectric layers can include silicon oxide, and the second dielectric layers can include silicon nitride. In some implementations, to form the stack structure, the first dielectric layers and the second dielectric layers are alternatingly deposited above a substrate. The substrate can be a silicon substrate.

Figure 8A:
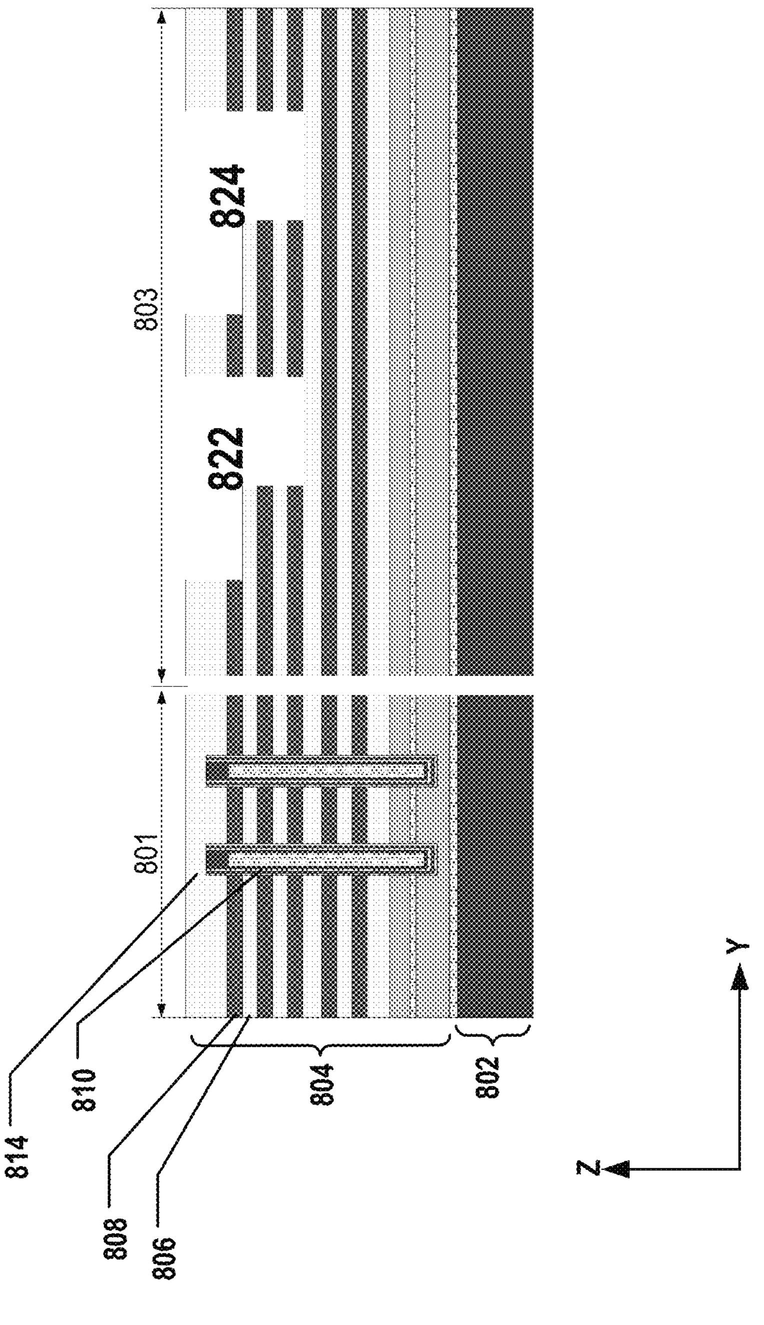
FIGS. 8A-8H illustrate a fabrication process for forming multiple sections of word line pick-up structures, according to some aspects of the present disclosure.
Figure 9A:
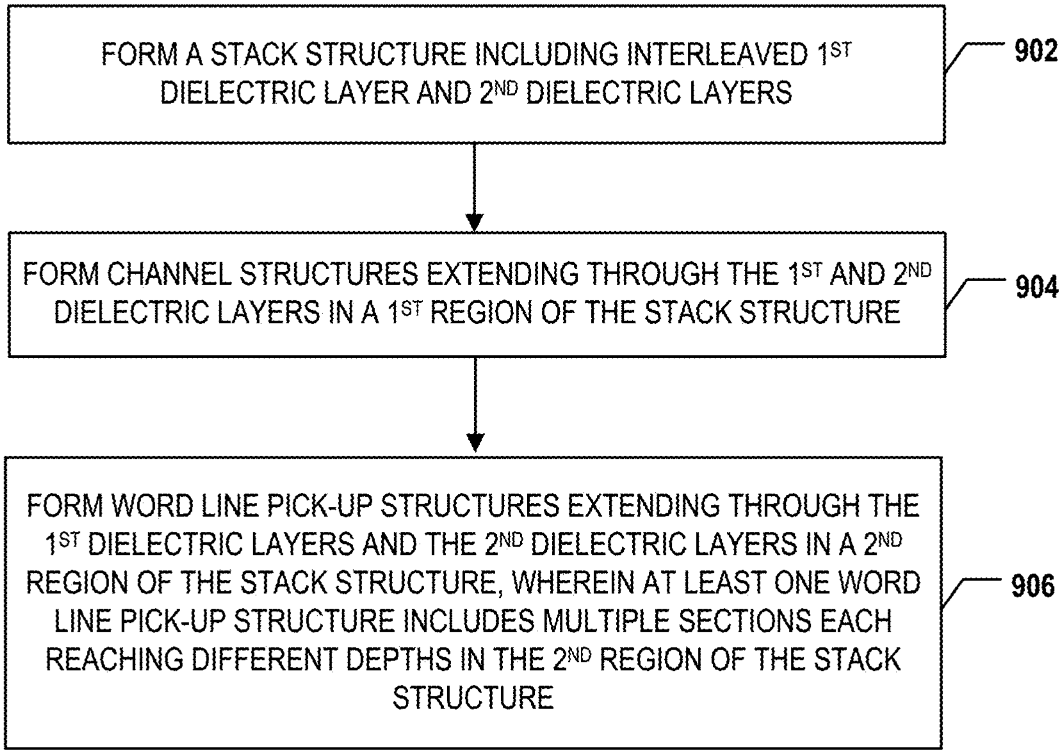
FIG. 9A is a flowchart of a method for forming a 3D memory device having multi-sectional word line pick-up structures, according to some aspects of the present disclosure.
Figure 9B:
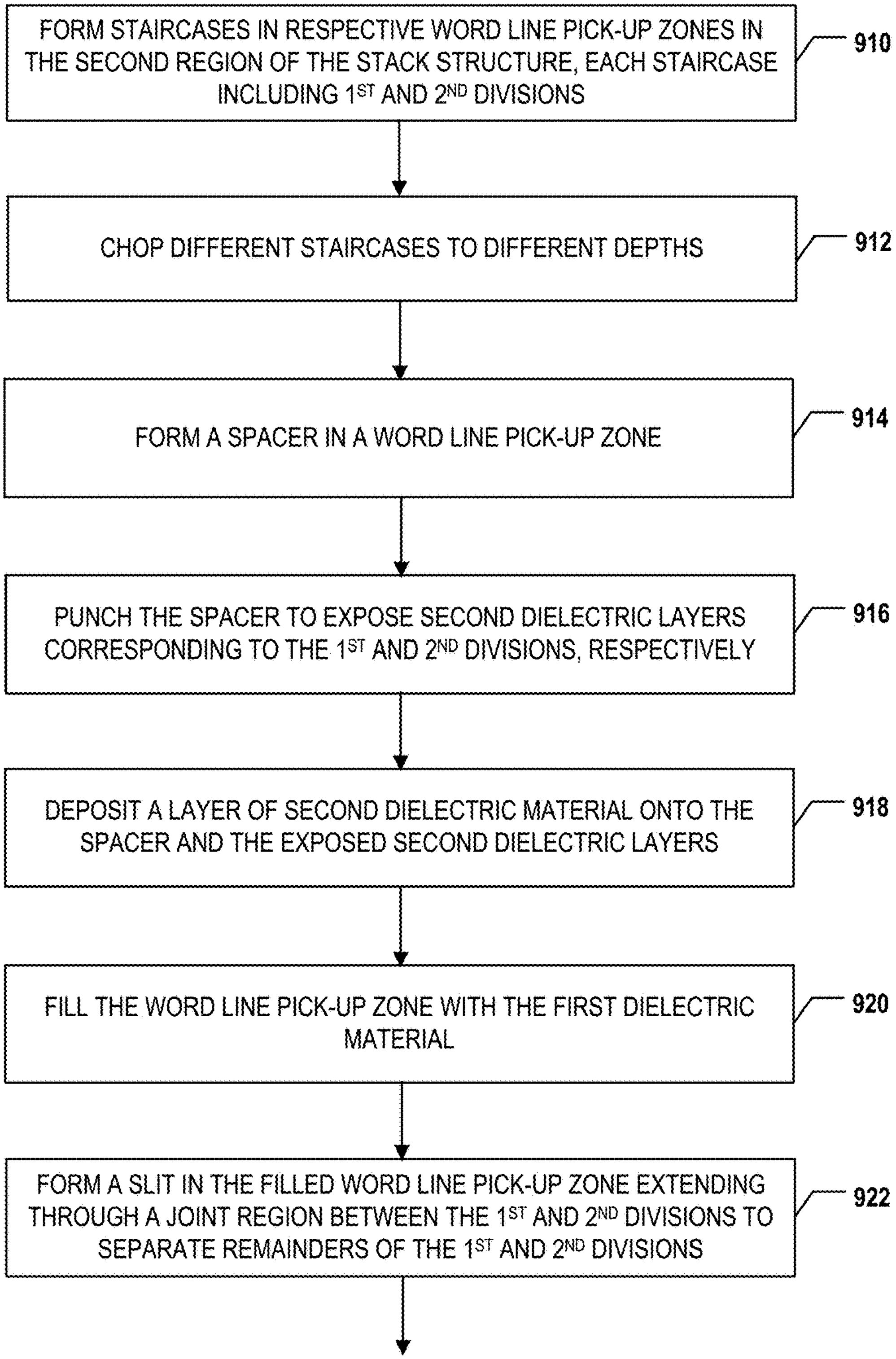
FIGS. 9B and 9C is a flowchart of an exemplary implementation of an operation of the method shown in FIG. 9A, according to some aspects of the present disclosure.
Figure 9C:
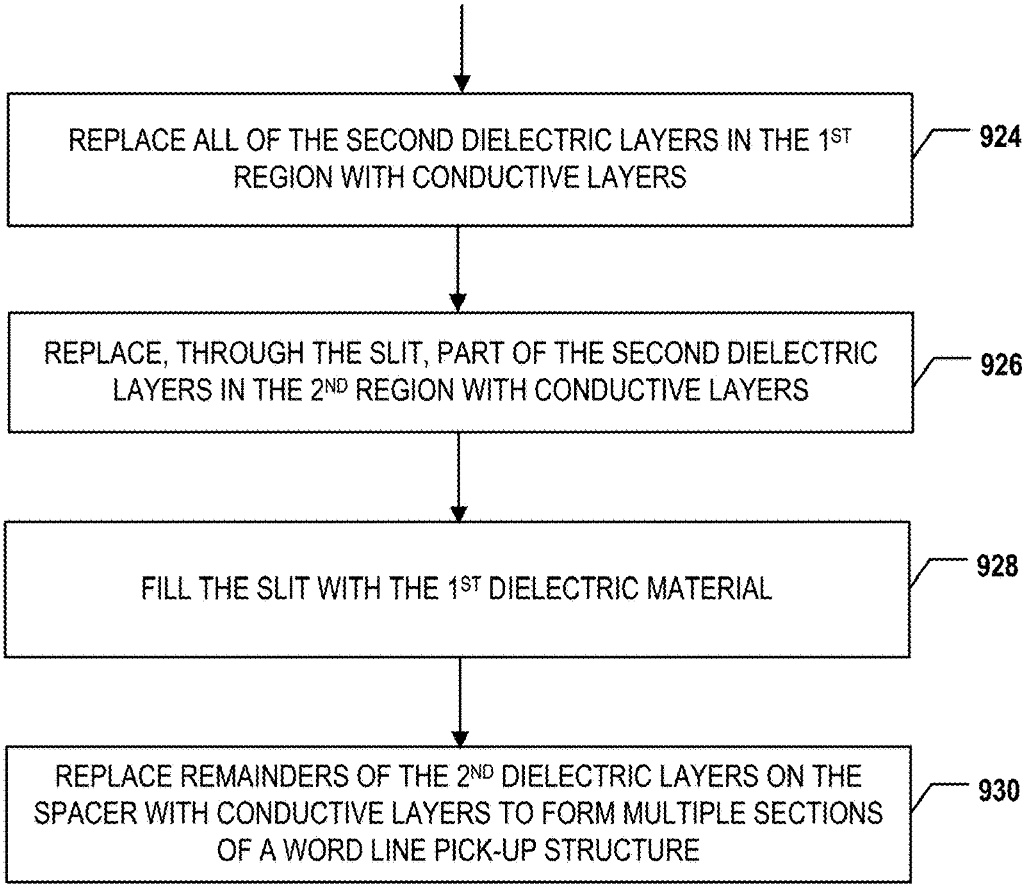

FIG. 8A illustrates such a stack structure 804 including multiple pairs of a first dielectric layer 806 and a second dielectric layer 808 (a.k.a., a stack sacrificial layer) formed above a silicon substrate 802. Stack structure 804 includes vertically interleaved first dielectric layers 806 and second dielectric layers 808, according to some implementations. First and second dielectric layers 806 and 808 can be alternatingly deposited above silicon substrate 802 to form stack structure 804. In some implementations, each first dielectric layer 806 includes a layer of silicon oxide, and each second dielectric layer 808 includes a layer of silicon nitride. Stack structure 804 can be formed by one or more thin film deposition processes including, but not limited to, chemical vapor deposition (CVD), physical vapor deposition (PVD), atomic layer deposition (ALD), or any combination thereof.

Returning to FIG. 9A, method 900 proceeds to operation 904, in which channel structures extending through the first dielectric layers and the second dielectric layers are formed in a first region of the stack structure. In some implementations, to form the channel structure, a channel hole extending vertically through the stack structure is formed, and a memory layer and a channel layer are sequentially formed over sidewalls of the channel hole. In some implementations, to form the channel structure, a channel hole extending vertically through the stack structure is formed, and a high-k gate dielectric layer, a memory layer, and a channel layer are sequentially formed over sidewalls of the channel hole.

FIG. 8A illustrates channel structures 814 formed in a core array region 801 of stack structure 804, for example, corresponding to core array region 101 of stack structure 501 in FIG. 5. To form each channel structure 814, as illustrated in FIG. 8A, a channel hole 810, which is an opening extending vertically through stack structure 804, can be formed first in core array region 801. In some implementations, a plurality of openings are formed, such that each opening becomes the location for growing an individual channel structure 814 in the later process. In some implementations, fabrication processes for forming channel hole 810 of channel structure 814 include wet etching and/or dry etching, such as deep-ion reactive etching (DRIE).

A memory layer (including a blocking layer, a storage layer, and a tunneling layer) and a channel layer can be sequentially formed in this order along sidewalls and the bottom surface of channel hole 810. In some implementations, the memory layer is first deposited along the sidewalls and bottom surface of channel hole 810, and the semiconductor channel is then deposited over the memory layer. The blocking layer, storage layer, and tunneling layer can be subsequently deposited in this order using one or more thin film deposition processes, such as ALD, CVD, PVD, any other suitable processes, or any combination thereof, to form the memory layer. The channel layer can then be formed by depositing a semiconductor material, such as polysilicon, over the tunneling layer of the memory layer using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are subsequently deposited to form the memory layer and the channel layer of channel structure 814.

In some implementations, a high-k gate dielectric layer is formed before the formation of the memory layer. That is, the high-k gate dielectric layer, memory layer (including the blocking layer, storage layer, and tunneling layer), and the channel layer can be sequentially formed in this order along sidewalls and the bottom surface of channel hole 810. In some implementations, the high-k gate dielectric layer is first deposited along the sidewalls and bottom surfaces of channel hole 810, the memory layer is then deposited over the high-k gate dielectric layer, and the semiconductor channel is then deposited over the memory layer. The high-k gate dielectric layer can be formed by depositing high-k dielectric materials, such as aluminum oxide, using one or more thin film deposition processes, such as ALD, CVD, PVD, any other suitable processes, or any combination thereof. The blocking layer, storage layer, and tunneling layer can be subsequently deposited in this order using one or more thin film deposition processes, such as ALD, CVD, PVD, any other suitable processes, or any combination thereof, over the high-k gate dielectric layer to form the memory layer. The channel layer can then be formed by depositing a semiconductor material, such as polysilicon, over the tunneling layer of the memory layer using one or more thin film deposition processes, such as ALD, CVD, PVD, any other suitable processes, or any combination thereof. In some implementations, an aluminum oxide layer, a first silicon oxide layer, a silicon nitride layer, a second silicon oxide layer, and a polysilicon layer (a "SONO" structure) are subsequently deposited to form the high-k gate dielectric layer, the memory layer, and the channel layer of channel structure 814.

Referring back to FIG. 9A, method 900 proceeds to operation 906, in which word line pick-up structures extending through the first dielectric layers and the second dielectric layers in the second region of the stack structure are formed. The word line pick-up structures may include multiple sections (e.g., sections 1-4 shown in FIG. 3 and sections A and B in FIG. 6) each reaching different depths in the second region of the stack structure. Operation 906 can be implemented, for example, by a process shown in FIGS. 9B and 9C. Referring to FIG. 9B, operation 906 may start at step 910, in which staircases in respective word line pick-up zones in the second region of the stack structure are formed. Each staircase may include first and second divisions. FIGS. 7A-7J illustrate an exemplary process of implementing step 910 to form staircases in word line pick-up zones.

Figure 7B:
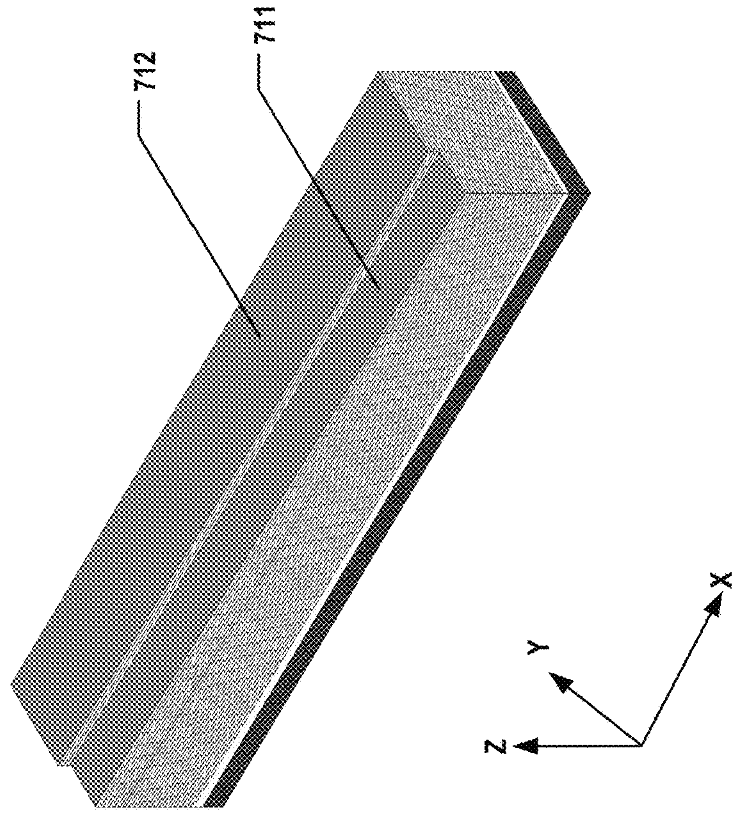
FIGS. 7A-7J illustrate a fabrication process for forming word line pick-up zones of a 3D memory device having multi-sectional word line pick-up structures, according to some aspects of the present disclosure.
Figure 7A:
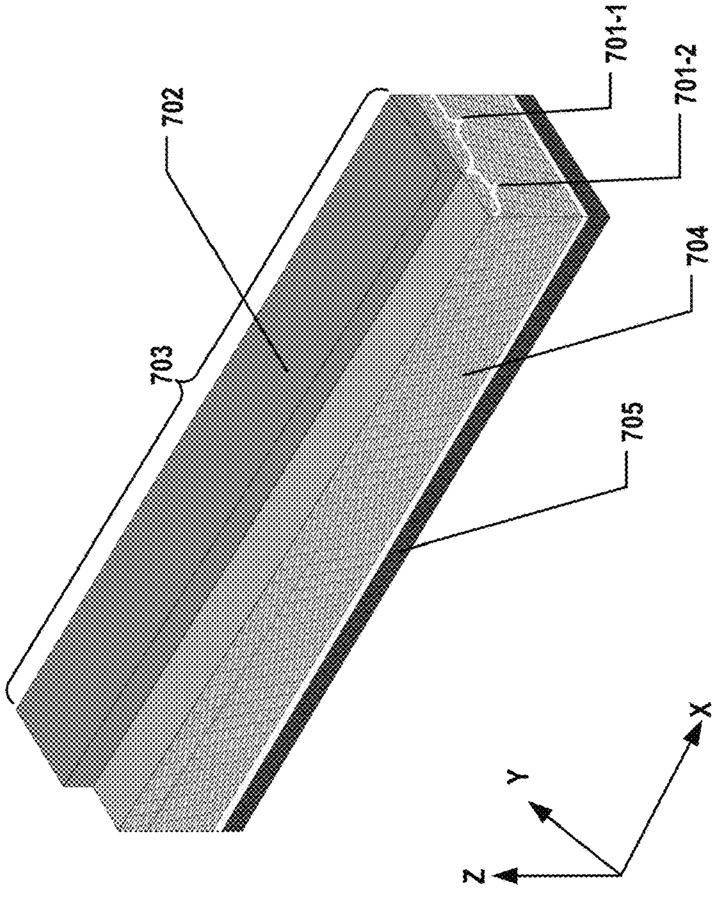

FIG. 7A illustrates an initial step of forming staircases in word line pick-up zones of a word line pick-up region 703 (e.g., similar to word line pick-up region 103 in FIGS. 1 and 5). For simplicity and clarity, only the word line pick-up region 703 is shown in FIG. 7A, while the core array region is omitted. As shown in FIG. 7A, a patterned photoresist layer 702 can be formed on a stack structure 704, covering a first part 701-1 and leaving a second part 701-2 uncovered. Stack structure 704 may include interleaved first dielectric layers and second dielectric layers. The first dielectric layers may include a first dielectric material, such as silicon oxide, and the second dielectric layers may include a second dielectric material, such as silicon nitride. Stack structure 704 can be formed on a substrate 705 (e.g., similar to substrate 503 in FIG. 5).

FIG. 7B shows the resulting initial staircase structure along the y direction after the word line pick-up region 703 shown in FIG. 7A undergoes a photolithography process. As shown in FIG. 7B, the initial staircase structure includes a lower division 711 and a higher division 712.

Figure 7C:
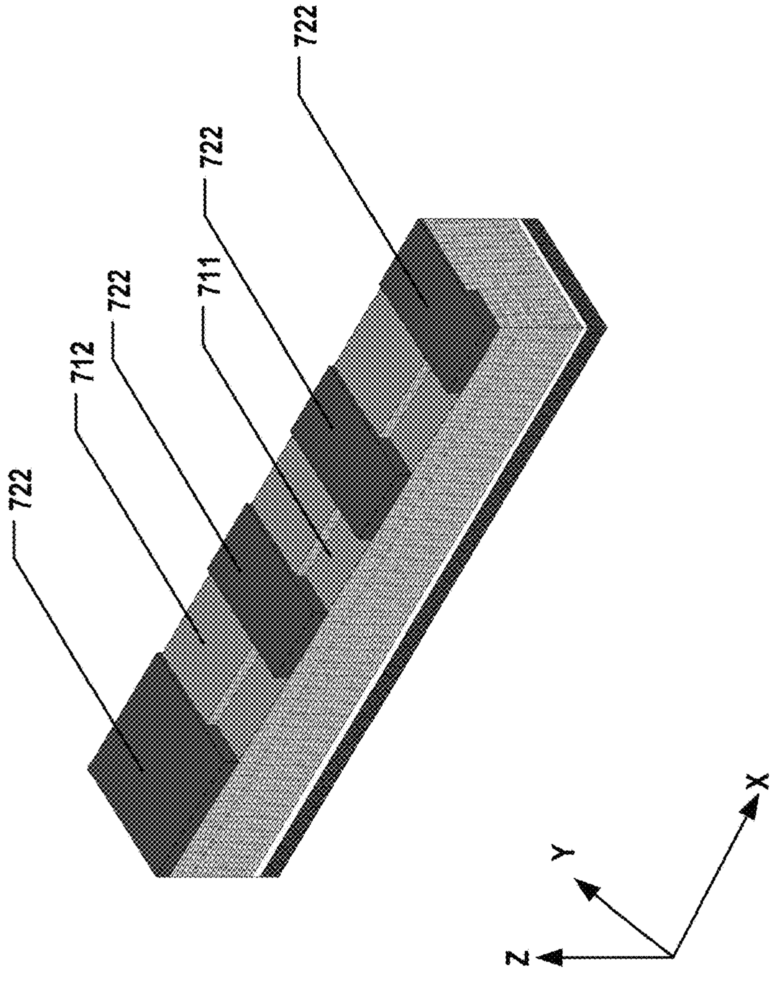

FIG. 7C shows the next step in forming staircases in word line pick-up zones, in which a patterned photoresist layer 722 is formed on the initial staircase shown in FIG. 7B. The patterned photoresist layer 722 may cover multiple areas each including portions of both lower division 711 and higher division 712. Multiple uncovered areas may each include portions of both lower division 711 and higher division 712. In some embodiments, multiple covered areas may have the same size. In some embodiments, multiple uncovered areas may have the same size. In some embodiments, multiple covered areas may be separated from one another by the same distance along x direction. In some embodiments, multiple uncovered areas may be separated from one another by the same distance along x direction.

Figure 7D:
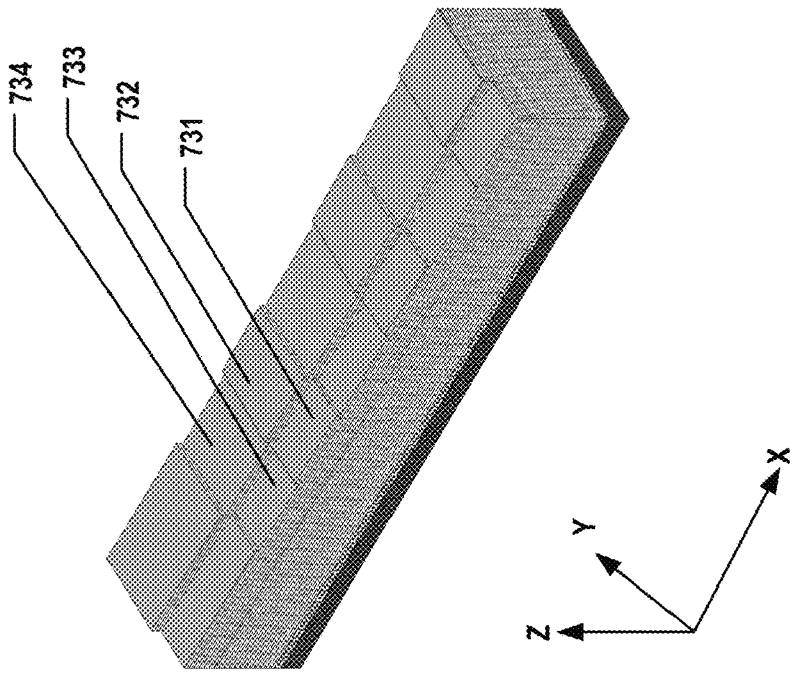

FIG. 7D shows the resulting intermediate staircase structure along both x and y directions after the word line pick-up region shown in FIG. 7C undergoes a photolithography process. Each intermediate staircase structure includes four divisions: 731, 732, 733, and 734. Among the four divisions, 731 and 732 may remain at the same height as 711 and 712, respectively, as they were covered by photoresist layer 722 in the previous photolithography process. On the other hand, division 733 may be lower than 731, and division 734 may be lower than 732, as some materials originally above divisions 733 and 734 may be etched away in the previous photolithography process. In some embodiments, division 732 may be the highest, followed by division 731, then division 734, and division 733 is the lowest among the four divisions of the intermediate staircase structure. In some embodiments, each of the four divisions may be at a height corresponding to a second dielectric layer. In some embodiments, the four divisions may be at heights corresponding to four adjacent second dielectric layers. Two second dielectric layers are adjacent when they are separated by only one first dielectric layer.

Figure 7F:
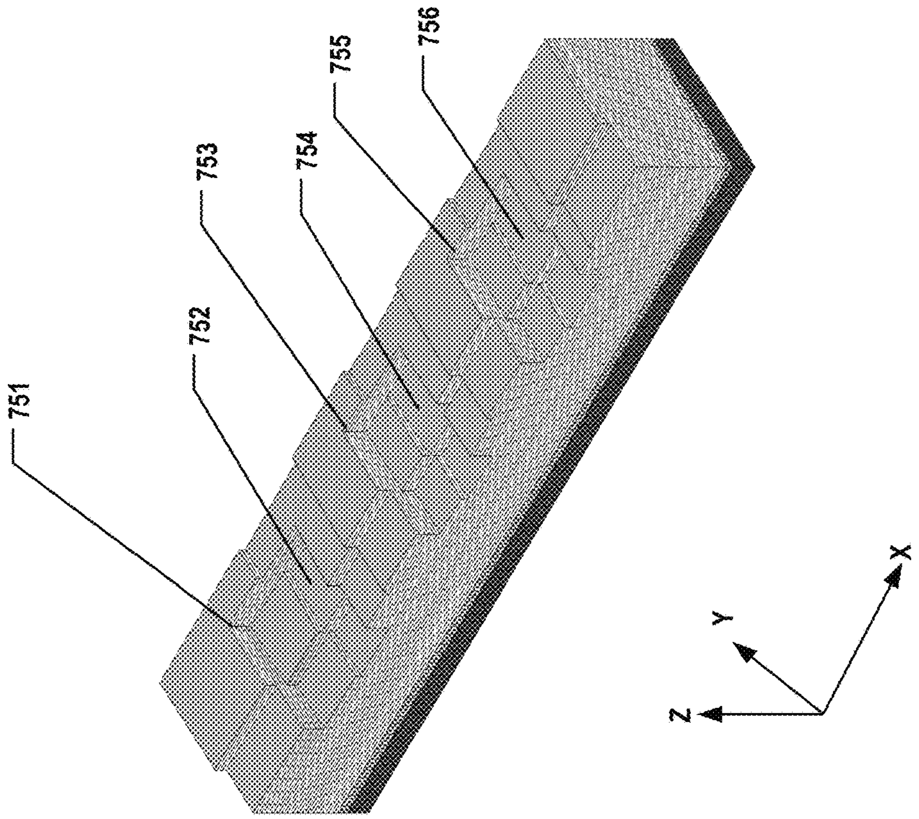
Figure 7E:
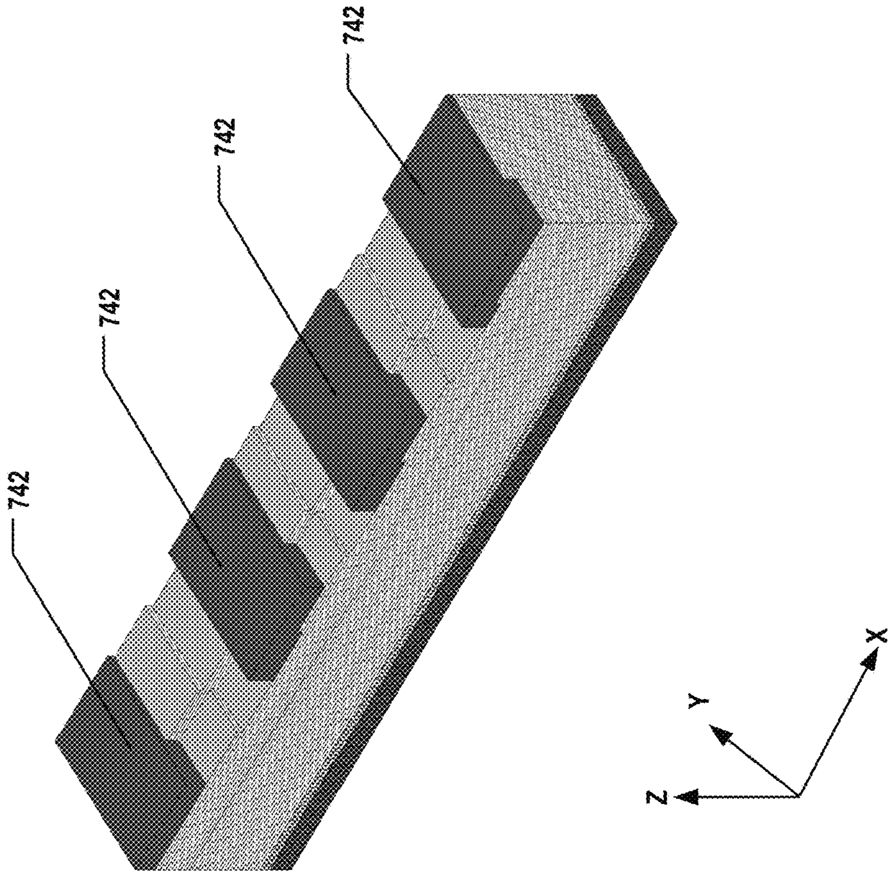

FIG. 7E shows the next step in forming staircases in word line pick-up zones, in which a patterned photoresist layer 742 is formed on the intermediate staircases shown in FIG. 7D. Similar to FIG. 7C, the patterned photoresist layer 742 may cover areas each including portions of all four divisions 731-734. Multiple uncovered areas may each include portions of all four divisions 731-734. In some embodiments, multiple covered areas may have the same size. In some embodiments, multiple uncovered areas may have the same size. In some embodiments, the covered areas may be separated from one another by the same distance along the x direction. In some embodiments, the uncovered areas may be separated from one another by the same distance along the x direction.

FIG. 7F shows the resulting word line pick-up zones (751, 753, 755) arranged along x direction each having a staircase (752, 754, 756) at the first depth after the word line pick-up region shown in FIG. 7E undergoes a photolithography process. Each word line pick-up zone is located in a recessed portion of the word line pick-up region and has a staircase at its bottom. Each staircase may have four divisions similar to 731-734. Staircases 752, 754, and 756 shown in FIG. 7F may have the same depth (e.g., the first depth). Two staircases have the same depth when each corresponding division is located at the same depth.

Figure 7G:
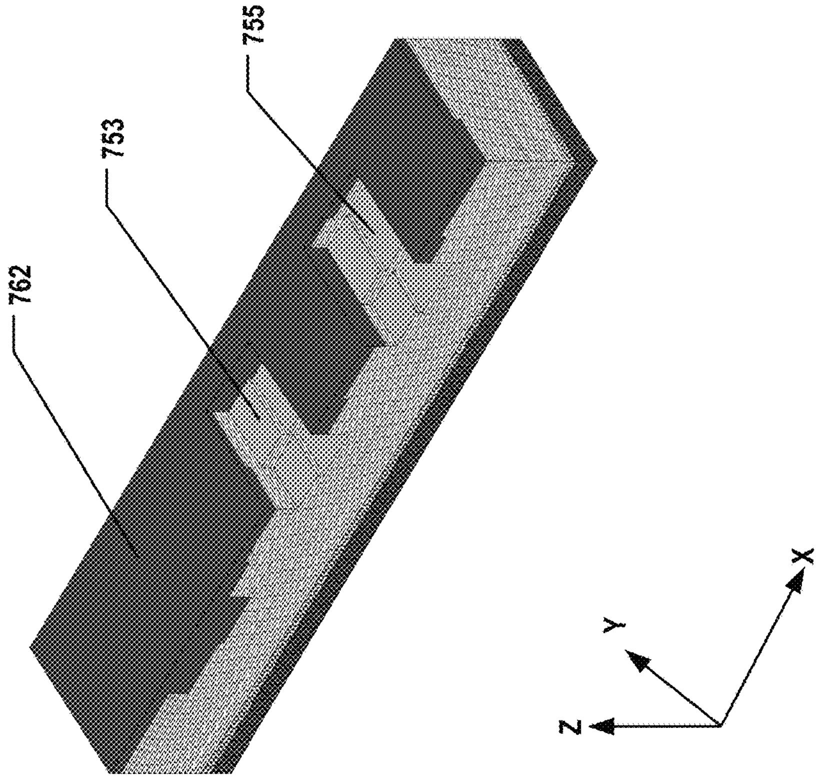

FIG. 7G shows the next step in forming staircases in word line pick-up zones, in which a patterned photoresist layer 762 is formed on the word line pick-up zone shown in FIG. 7F. As shown in FIG. 7G, word line pick-up zone 751 shown in FIG. 7F is covered, while word line pick-up zones 753 and 755 are not covered.

Figure 7H:
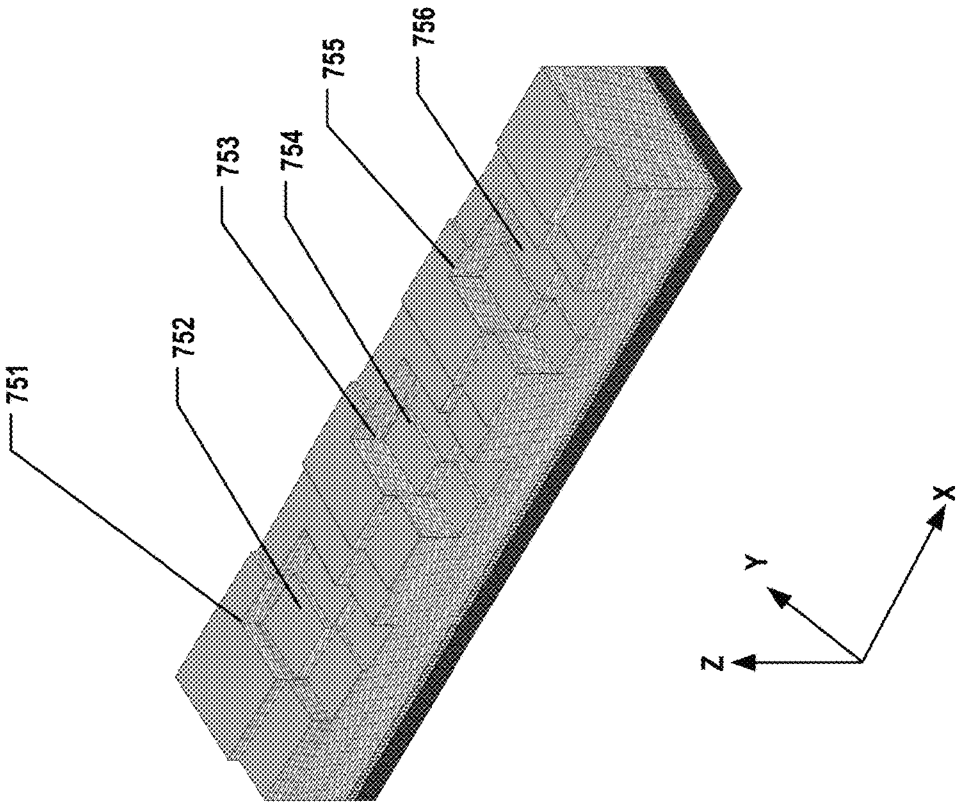

FIG. 7H shows the resulting word line pick-up zones (751, 753, 755) after the word line pick-up region shown in FIG. 7G undergoes a photolithography process. As shown in FIG. 7H, the bottom (staircase 752) of word line pick-up zone 751 may remain at the first depth, while the bottoms (staircases 754 and 756) may be lowered to a second depth due to the photolithography process. The second depth is deeper (lower) than the first depth.

Figure 7J:
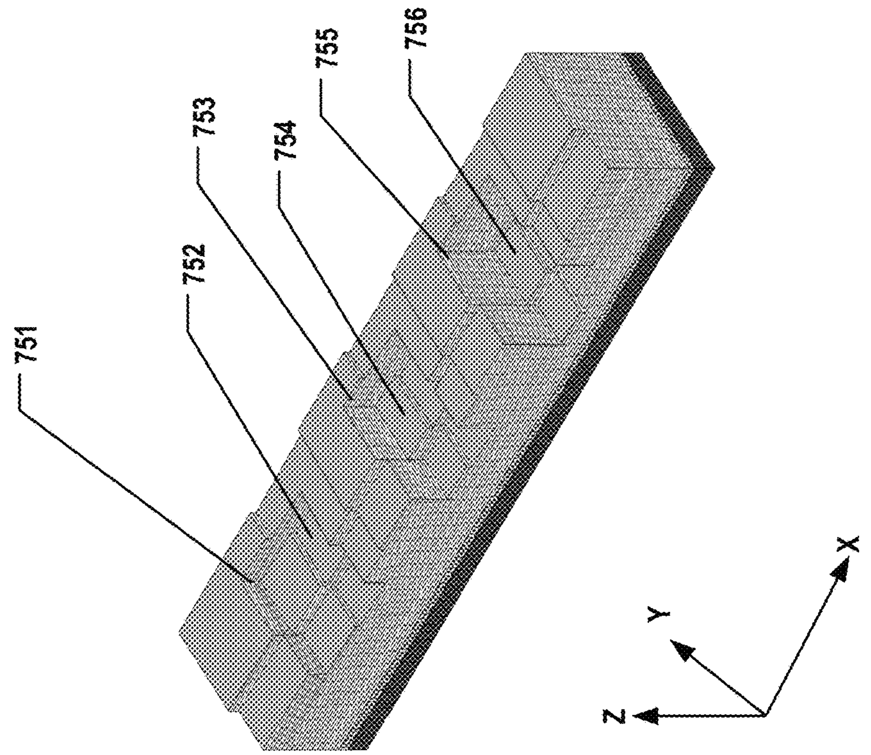
Figure 7I:
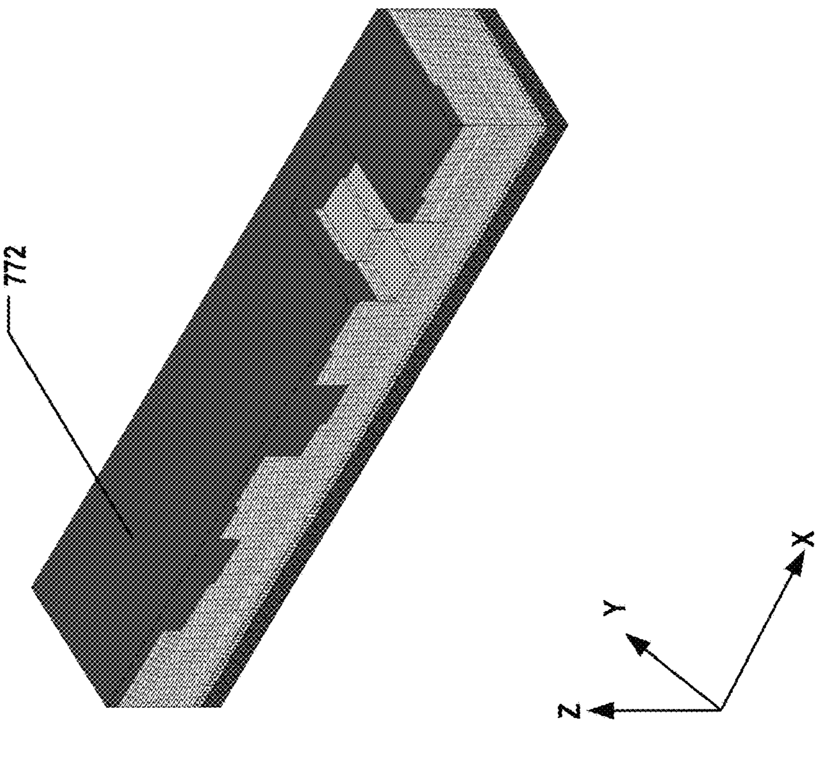

FIG. 7I shows the next step in forming staircases in word line pick-up zones, in which a patterned photoresist layer 772 is formed on the word line pick-up zone shown in FIG. 7H. As shown in FIG. 7I, word line pick-up zones 751 and 753 shown in FIG. 7H are covered, while word line pick-up zone 755 is not covered.

FIG. 7J shows the resulting word line pick-up zones (751, 753, 755) after the word line pick-up region shown in FIG. 7I undergoes a photolithography process. As shown in FIG. 7J, the bottom (staircase 752) of word line pick-up zone 751 may remain at the first depth, the bottom (staircase 754) of word line pick-up zone 753 may remain at the second depth, while the bottom (staircase 756) of word line pick-up zone 755 may be lowered to a third depth due to the photolithography process. The third depth is deeper (lower) than the second depth.

In some embodiments, word line pick-up zone 751 may be located closer to the core array region along x direction than word line pick-up zone 753, and word line pick-up zone 753 may be located closer to the core array region along x direction than word line pick-up zone 755. That is, the closer a word line pick-up zone is to the core array region, the shallower its bottom goes. As discussed above in connection with FIG. 4, this arrangement may facilitate uninterrupted electrical current passage from the word line pick-up region to the core array region.

While FIGS. 7A-7J show the formation of three word line pick-up zones extending to different depths, any number of word line pick-up zones can be formed in a similar manner.

Referring back to FIG. 9B, operation 906 proceeds to step 912, in which staircases in word line pick-up zones are chopped to different depths. Once the staircase shape at the bottom of a word line pick-up zone is formed, the staircase can be further extended to any depth using a chopping process. As used herein, a "chopping" process is a process that increases the depth of one or more openings (e.g., word line pick-up zones) extending through a dielectric stack structure including interleaved first and second dielectric layers by a plurality of etching cycles. Each etch cycle can include one or more dry etch and/or wet etch processes that etch one pair of first and second dielectric layers, i.e., reducing the depth by one dielectric layer pair. The purpose of the chopping process is to make multiple openings (e.g., 751, 753, 755) at different depths. Accordingly, depending on the number of openings, a certain number of chopping processes, along with a number of chopping masks, may be needed. It is understood that the number of chopping masks, the sequence of the chopping masks, the design (e.g., the number and pattern of openings) of each chopping mask, and/or the reduced depth by each chopping process (e.g., the number of etching cycles) may affect the specific depth of each opening after the chopping process. A detailed description of the chopping process can be referenced in U.S. patent application Ser. No. 16/881,168, filed on May 22, 2022, and U.S. patent application Ser. No. 16/881,339, filed on May 22, 2022, both of which are incorporated by reference in their entireties herein.

FIG. 8A illustrates both core array region 801 and word line pick-up region 803 in the z-y plane. As shown in FIG. 8A, word line pick-up region 803 includes multiple word line pick-up zones 822, 824. Because word line pick-up zones 822 and 824 shown in FIG. 8A are in the z-y plane (e.g., both have the same literal distance along x direction to core array region 801), they can have the same depth. FIG. 8A shows an intermediate state after the multiple word line pick-up zones (e.g., 822, 824) have been chopped to appropriate depths (i.e., step 912).

Referring back to FIG. 9B, operation 906 proceeds to step 914, in which a spacer is formed in a word line pick-up zone. In some embodiments, the spacer is formed on the sidewalls and the bottom surface of the word line pick-up zone, thereby covering first dielectric layers 806 and second dielectric layers 808 exposed from the sidewalls of the word line pick-up zone. In some implementations, the spacer is formed by depositing dielectric materials, such as silicon oxide, using one or more thin film deposition processes, such as ALD, CVD, PVD, any other suitable processes, or any combination thereof, over the sidewalls and the bottom surface of the word line pick-up zone.

Figure 8B:
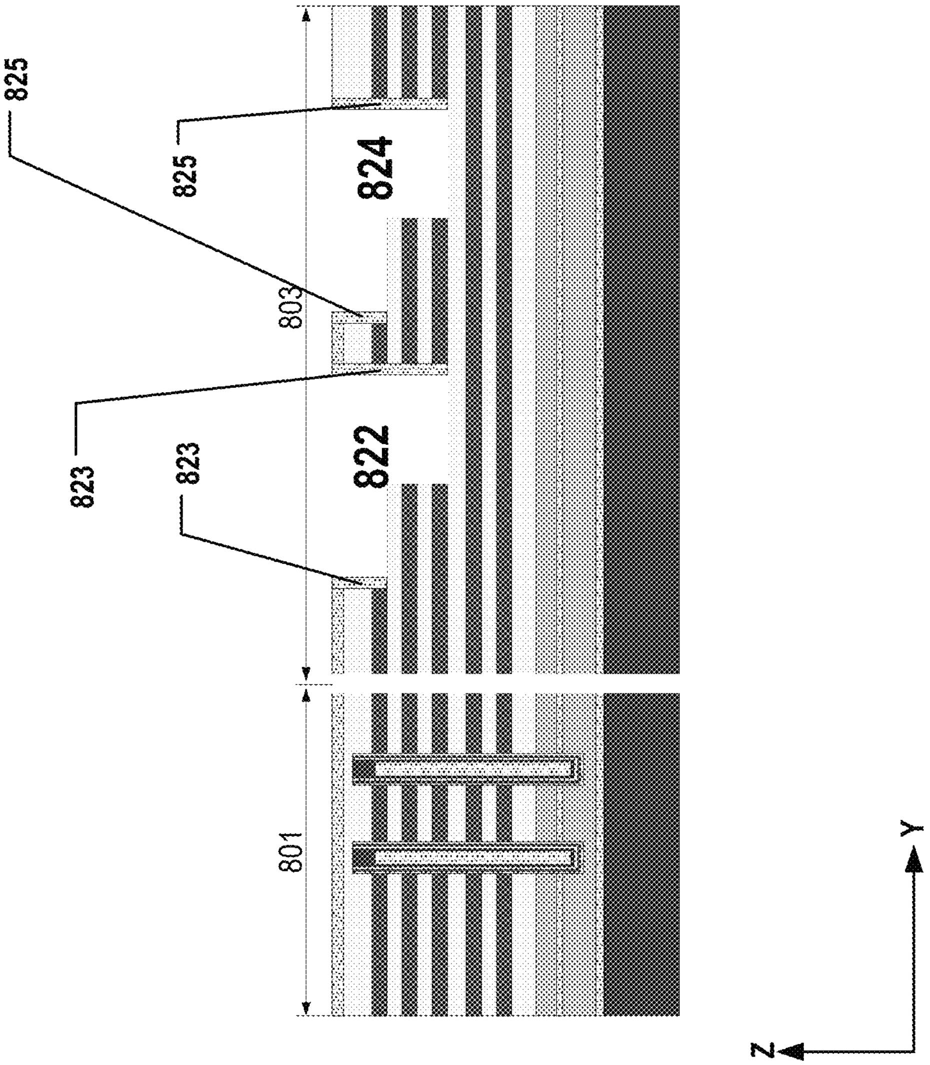

After the spacer is formed, operation 906 proceeds to step 916, in which the spacer is punched to expose second dielectric layers corresponding to the first and second divisions, respectively. FIG. 8B shows that spacer 823 remains on the sidewalls but not on the bottom of word line pick-up zone 822. Similarly, spacer 825 remains on the sidewalls but not on the bottom of word line pick-up zone 824. Therefore, the second dielectric layers at the bottom of the word line pick-up zones corresponding to the divisions of the staircases are exposed.

In some embodiments, the spacer on the bottom of the word line pick-up zone can be removed through a spacer punch operation to "punch" through the spacer in the z direction to expose only a corresponding second dielectric layer from the bottom, but not other second dielectric layers from the sidewalls. The spacer punch operation can be implemented by dry etching, for example, by controlling the etching rate, direction, and/or duration of ion reactive etching (RIE) to etch only the part of spacer 823/825 on the bottom surface, but not on the sidewalls.

Figure 8C:
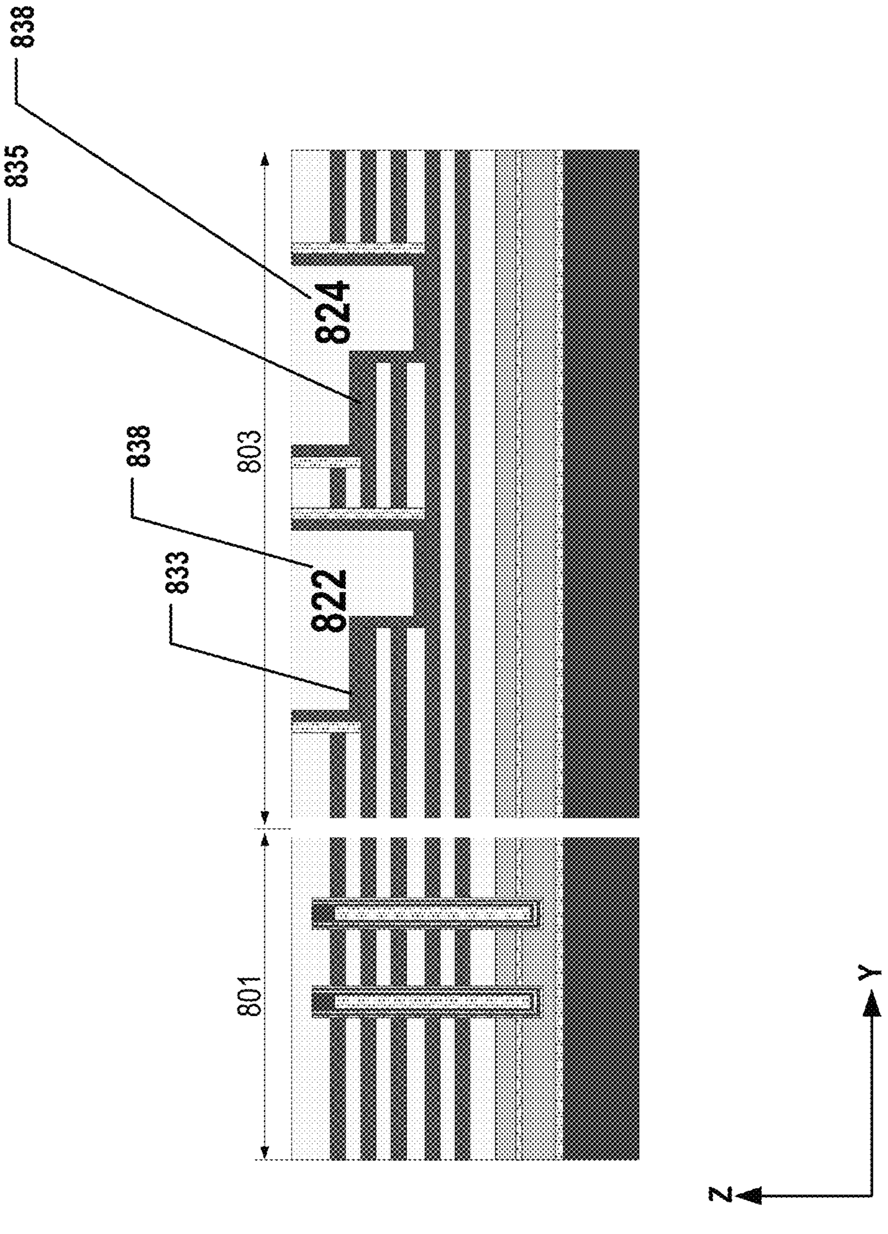

Referring back to FIG. 9B, operation 906 proceeds to step 918, in which a layer of second dielectric material, such as silicon nitride, is deposited onto the spacer and the exposed second dielectric layers. FIG. 8C shows that a layer of second dielectric material 833 is deposited onto the spacer (on the sidewalls) and the exposed second dielectric layer (on the bottom) of word line pick-up zone 822, and a layer of second dielectric material 835 is deposited onto the spacer (on the sidewalls) and the exposed second dielectric layer (on the bottom) of word line pick-up zone 824.

Referring back to FIG. 9B, operation 906 proceeds to step 920, in which the word line pick-up zone is filled with the first dielectric material, such as silicon oxide. FIG. 8C shows that word line pick-up zones 822 and 824 are both filled with the first dielectric material 838.

Figure 8D:
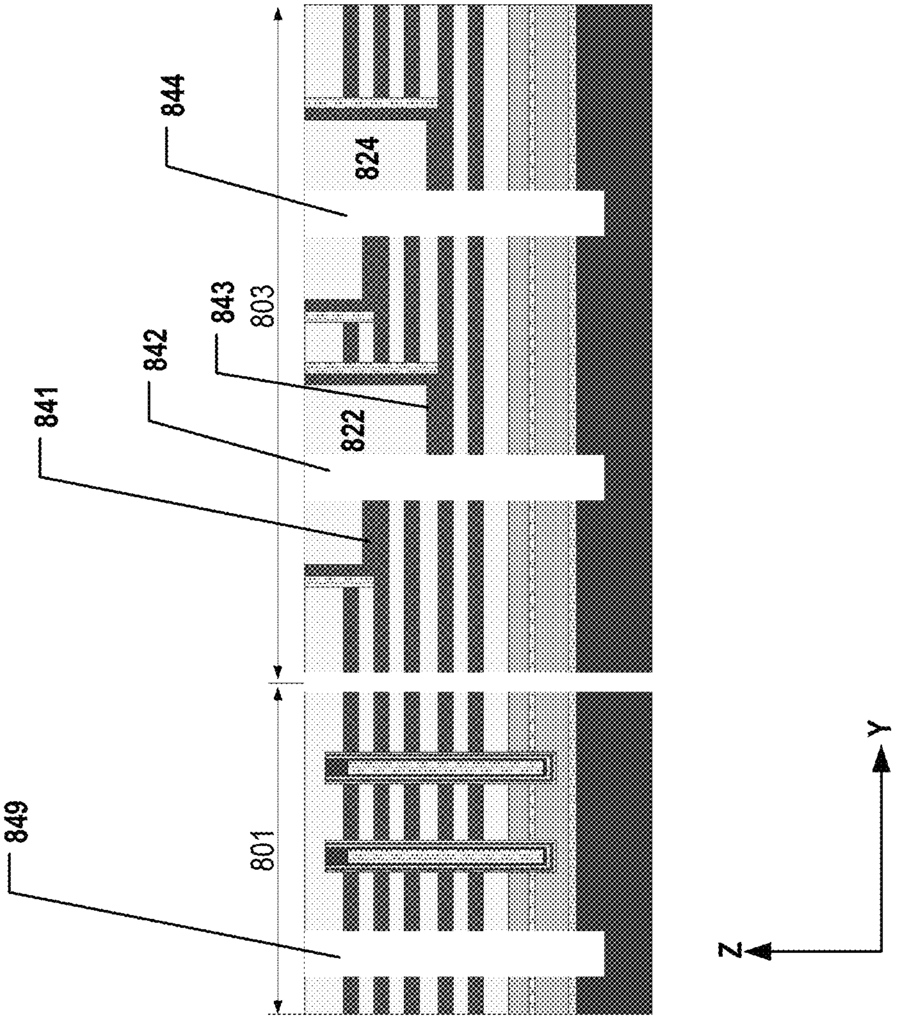

Referring back to FIG. 9B, operation 906 proceeds to step 922, in which a slit is formed in the filled word line pick-up zone. The slit may extend through a joint region between the first and second divisions to separate reminders of the first and second divisions. As shown in FIG. 8D, a slit is an opening that extends vertically through first and second dielectric layers of stack structure 804. In some implementations, fabrication processes for forming a slit include wet etching and/or dry etching, such as DRIE, of first dielectric layers 806 and second dielectric layers 808. The etching process through stack structure 804 may not stop at the top surface of silicon substrate 802 and may continue to etch part of silicon substrate 802 to ensure that the slit extends vertically all the way through all first dielectric layers 806 and second dielectric layers 808 of stack structure 804.

FIG. 8D shows that a slit 842 extends through the stack structure in the word line pick-up region 803. In particular, slit 842 extends in the center area of word line pick-up zone 822, and extends through a joint region between divisions 841 and 843 to separate the remainders of divisions 841 and 843. In this way, the left and right portions of word line pick-up zone 822 are separated and electrically insulated. Similarly, slit 844 extends in the center area of word line pick-up zone 824 to separate the left and right portions of word line pick-up zone 824.

In some embodiments, one or more slits can also be formed in the core array region 801. For example, FIG. 8D shows that a slit 849 extends through the stack structure in the core array region 801. Slit 849 can be formed similarly to slits 842 and 844. In some embodiments, slits 842, 844, and 849 can be formed in a single process.

Figure 8E:
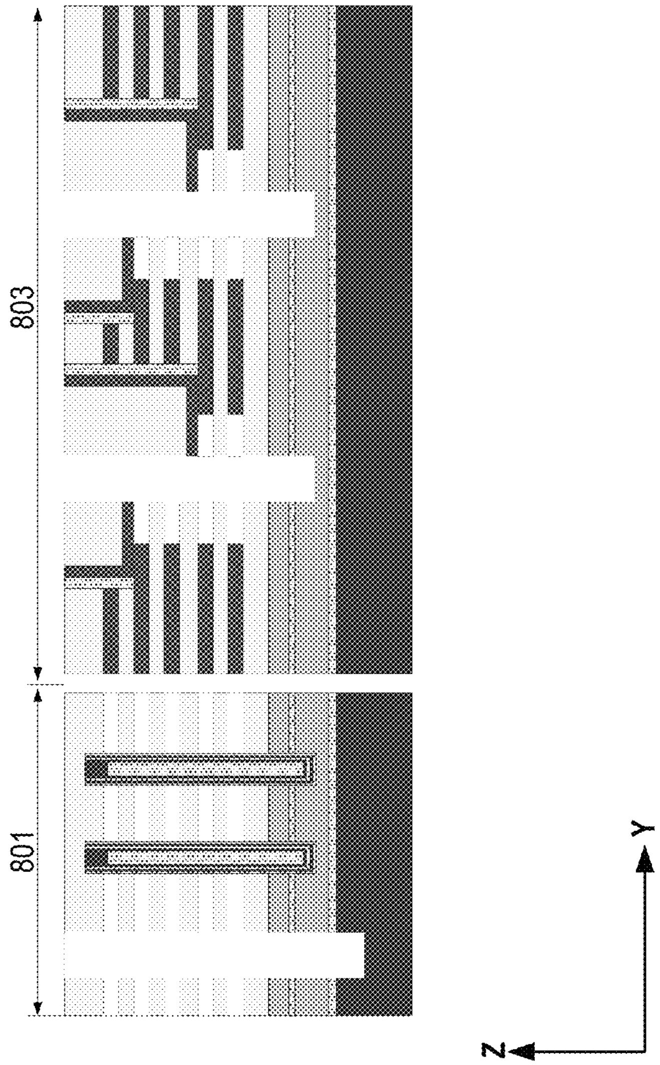
Figure 8F:
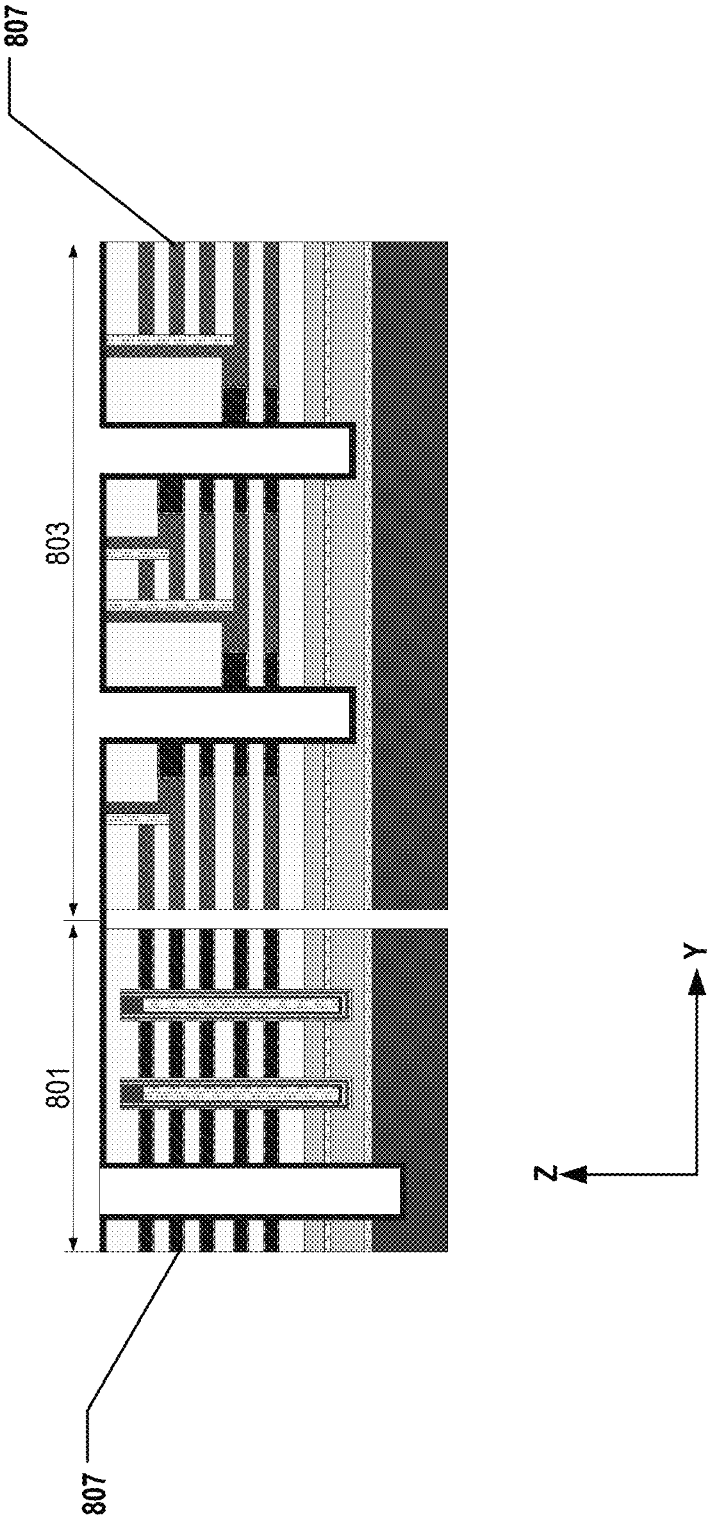

Referring to FIG. 9C, operation 906 proceeds to step 924, in which all of the second dielectric layers in the first region (e.g., core array region) are replaced with conductive layers by, for example, a gate replacement process. The conductive layer can include a metal. FIG. 8E shows that all of the second dielectric layers (e.g., silicon nitride layers) in the core array region 801 are removed, while FIG. 8F shows that all of the layers previously occupied by the second dielectric layers are replaced with conductive layers 807.

Referring back to FIG. 9C, operation 906 proceeds to step 926, in which part of the second dielectric layers in the second region are replaced with conductive layers through the slit. For example, this can be implemented by the same gate replacement process simultaneously with step 924. The conductive layer can include a metal. FIG. 8E shows that part of the second dielectric layers (e.g., silicon nitride layers) in the word line pick-up region 803 are removed, while FIG. 8F shows that the removed portion previously occupied by the second dielectric layers in the word line pick-up region 803 is replaced with conductive layers 807.

Figure 8G:
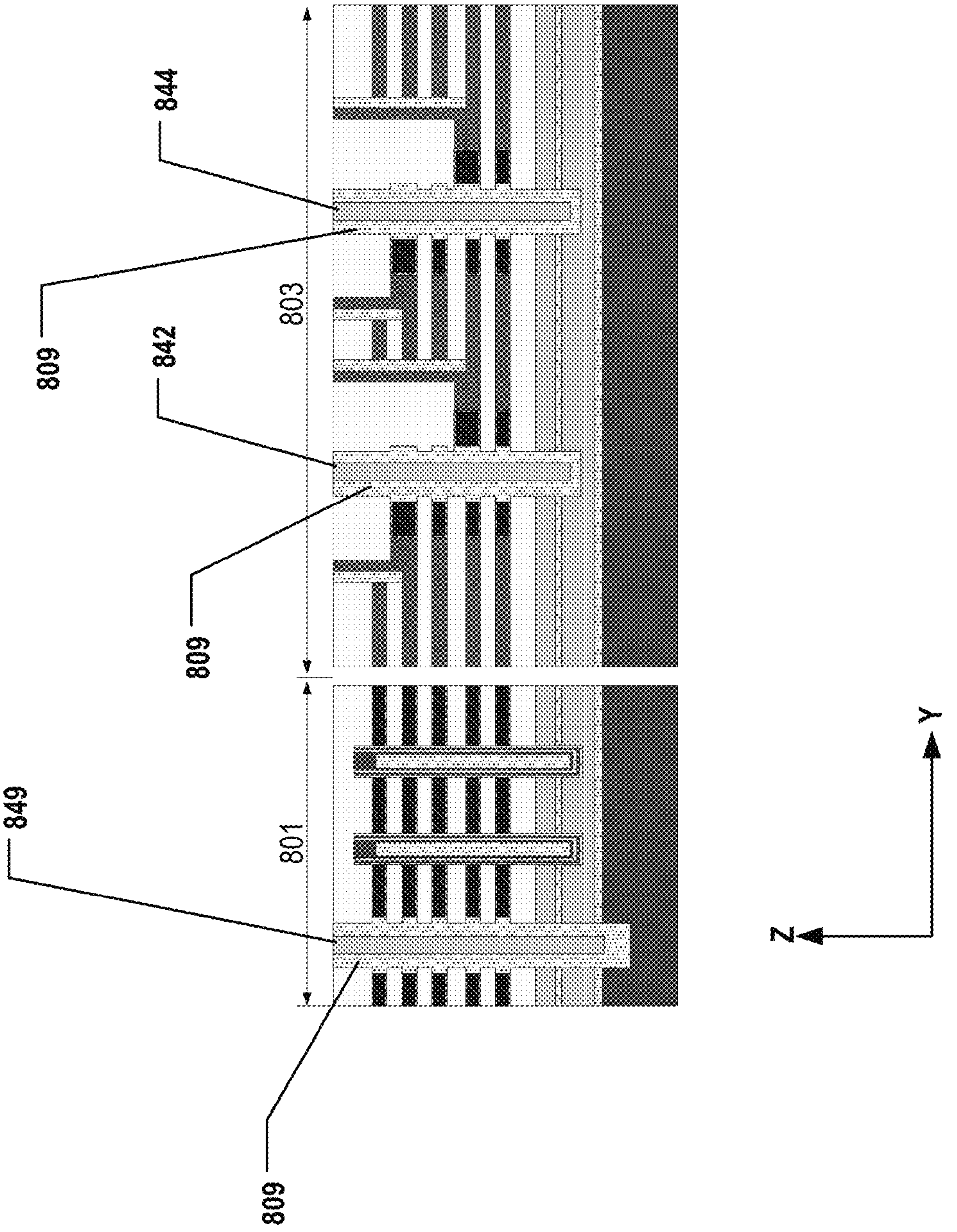

Referring back to FIG. 9C, operation 906 proceeds to step 928, in which the slit is filled with the first dielectric material. For example, the first dielectric material, such as silicon oxide, can be deposited into the slits in the core array region 801 as well as in the word line pick-up region 803 using one or more thin film deposition processes, such as CVD, PVD, ALD, or any combination thereof. FIG. 8G shows that slits 849, 842, and 844 are filled with first dielectric material (e.g., silicon oxide) 809.

Figure 8H:
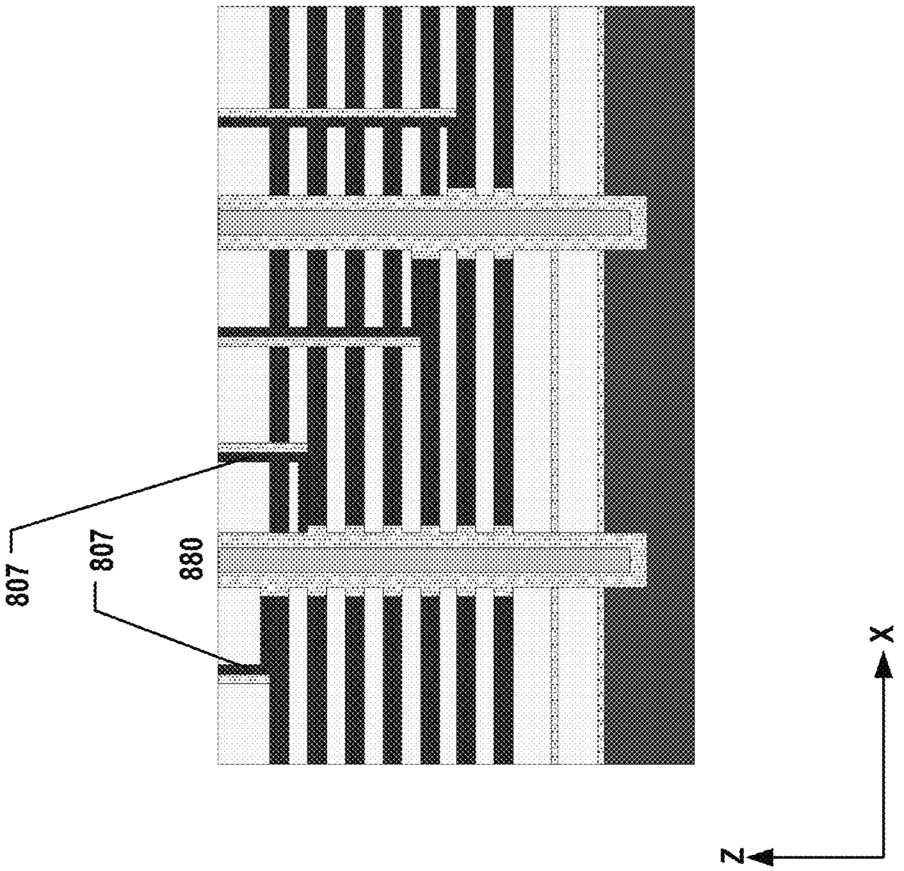

Referring back to FIG. 9C, operation 906 proceeds to step 930, in which the remainders of the second dielectric layers on the spacer are replaced with conductive layers to form multiple sections of a word line pick-up structure. FIG. 8H shows the x-z plane of the word line pick-up region. As shown in FIG. 8H, the remaining portion of the second dielectric material on the spacer is replaced with the conductive layers 807, thereby forming the vertical contact of a multi-sectional word line pick-up structure 880. As shown in FIG. 8H, word line pick-up structure 880 has left and right sections that are separate and electrically insulated from each other. The bottoms of these sections reach different depths and connect to different word lines.

Figure 10A:
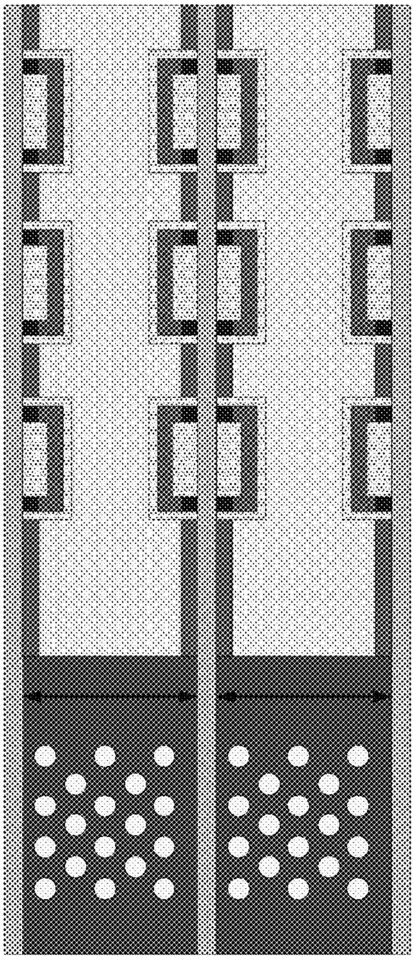
FIGS. 10A and 10B are plan views of some other exemplary 3D memory devices having multi-sectional word line pick-up structures, according to some aspects of the present disclosure.
Figure 10B:
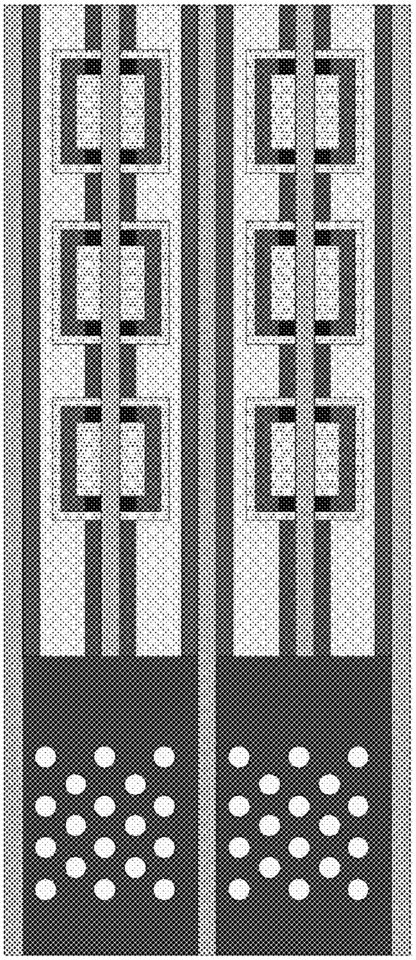
Figure 11B:
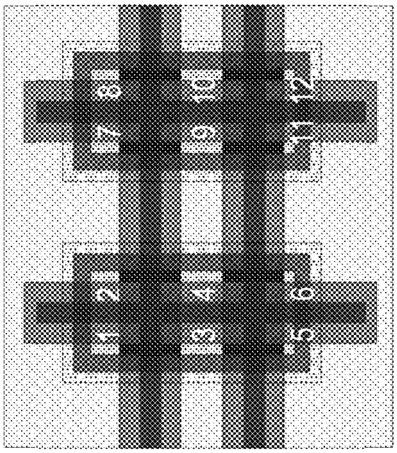
FIGS. 11A and 11B are plan views of some other exemplary multi-sectional word line pick-up structures, according to some aspects of the present disclosure.
Figure 11A:
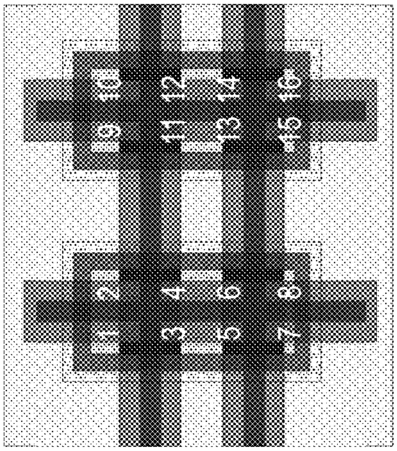
Figure 12B:
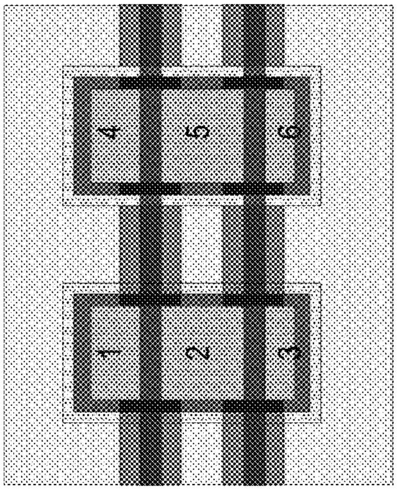
FIGS. 12A and 12B are plan views of some further exemplary multi-sectional word line pick-up structures, according to some aspects of the present disclosure.
Figure 12A:
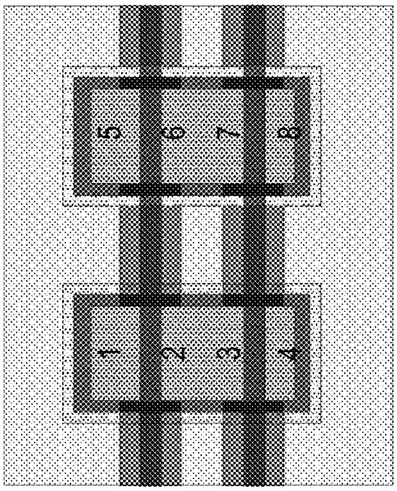

It is understood that the number of sections that can be used with the multi-sectional word line pick-up structure can vary. For example, FIGS. 10A and 10B show embodiments having two sections in each word line pick-up structure, where each word line pick-up structure is divided by a horizontal slit structure without using a vertical slit structure. In addition, the number of vertical contacts can also vary. FIG. 11A shows an embodiment where a word line pick-up structure has 8 vertical contacts, while FIG. 11B shows an embodiment where a word line pick-up structure has 6 vertical contacts. In other words, vertical contacts 3 and 5 in FIG. 11A can be combined into a single vertical contact 3 in FIG. 11B, and vertical contacts 4 and 6 in FIG. 11A can be combined into a single vertical contact 4 in FIG. 11B. FIGS. 12A and 12B show exemplary word line pick-up structures having three sections instead of six sections as in FIGS. 11A and 11B. Similar to FIGS. 11A and 11B, vertical contacts 2 and 3 in FIG. 12A can be combined into vertical contact 2 in FIG. 12*b*, and vertical contacts 6 and 7 in FIG. 12A can be combined into vertical contact 5 in FIG. 12*b*.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
- a plurality of channel structures in a first region;
- a plurality of word line pick-up structures in a second region; and
- a plurality of word lines each extending from the first region into at least a portion of the second region,
- wherein one word line pick-up structure of the plurality of word line pick-up structures comprises multiple sections each electrically connected to a single word line, and
- the multiple sections of the one word line pick-up structure are separated from each other by first and second slit structures, the first slit structure extending in a first direction within a plane perpendicular to a depth direction of the one word line pick-up structure, the second slit structure extending in a second direction within the plane, the second direction being perpendicular to the first direction, and the first and second slit structures extending in the depth direction of the one word line pick-up structure.

2. The 3D memory device of claim 1, wherein
- the multiple sections of the one word line pick-up structure are electrically insulated from each other.

3. The 3D memory device of claim 1, wherein
- one of the first and second slit structures extends from the second region into the first region.

4. The 3D memory device of claim 1, wherein
- one of the first and second slit structures extends within the second region without reaching into the first region.

5. The 3D memory device of claim 1, wherein
- the one word line pick-up structure is a first word line pick-up structure of the plurality of word line pick-up structures;
- the plurality of word line pick-up structures comprises a second word line pick-up structure; and
- the multiple sections of the second word line pick-up structure are separated from each other by third and fourth slit structures that are parallel to each other.

6. The 3D memory device of claim 1, wherein
- the multiple sections of the one word line pick-up structure comprises first and second sections electrically connected to first and second word lines, respectively, the first and second word lines being separated from each other by a dielectric layer.

7. The 3D memory device of claim 1, wherein the plurality of word line pick-up structures comprise first and second word line pick-up structures, the first word line pick-up structure being closer to the first region than the second word line pick-up structure;

the multiple sections of the first word line pick-up structure comprise a first plurality of sections electrically connected to a first plurality of word lines, respectively;

the multiple sections of the second word line pick-up structure comprise a second plurality of sections electrically connected to a second plurality of word lines, respectively; and each of the first plurality of word lines is located in higher layers measured from a substrate of the 3D memory device than any of the second plurality of the word lines.

8. The 3D memory device of claim 1, wherein each of the multiple sections of the one word line pick-up structure comprises:

a vertical contact; and an interconnect line in contact with the vertical contact and the corresponding word line.

9. The 3D memory device of claim 1, wherein the multiple sections of the one word line pick-up structure are electrically connected to different word lines.

10. The 3D memory device of claim 1, wherein the multiple sections of the one word line pick-up structure are arranged along both the first direction and the second direction.

11. The 3D memory device of claim 1, wherein the second slit structure extends in the second direction to divide the one word line pick-up structure into portions arranged along the first direction, and the first slit structure extends in the first direction to divide the one word line pick-up structure into portions arranged along the second direction.

12. A system, comprising:

a three-dimensional (3D) memory device configured to store data, the 3D memory device comprising:

a plurality of channel structures in a first region;

a plurality of word line pick-up structures in a second region; and a plurality of word lines each extending from the first region into at least a portion of the second region, wherein one word line pick-up structure of the plurality of word line pick-up structures comprises multiple sections each electrically connected to a single word line, and the multiple sections of the one word line pick-up structure are separated from each other by first and second slit structures, the first slit structure extending in a first direction within a plane perpendicular to a depth direction of the one word line pick-up structure, the second slit structure extending in a second direction within the plane, the second direction being perpendicular to the first direction, and the first and second slit structures extending in the depth direction of the one word line pick-up structure; and a memory controller electrically connected to the 3D memory device and configured to operate the channel structures through the word lines.

13. The system of claim 12, wherein the multiple sections of the one word line pick-up structure are electrically connected to different word lines.

14. The system of claim 12, wherein the multiple sections of the one word line pick-up structure are electrically insulated from each other.

15. The system of claim 12, wherein one of the first and second slit structures extends from the second region into the first region.

16. The system of claim 12, wherein the one word line pick-up structure is a first word line pick-up structure of the plurality of word line pick-up structures;

the plurality of word line pick-up structures includes a second word line pick-up structure; and the multiple sections of the second word line pick-up structure are separated from each other by third and fourth slit structures that are parallel to each other.

17. The system of claim 12, wherein the multiple sections of the one word line pick-up structure comprises first and second sections electrically connected to first and second word lines, respectively, the first and second word lines being separated from each other by a dielectric layer.

18. The system of claim 12, wherein the multiple sections of the one word line pick-up structure are arranged along both the first direction and the second direction.

19. The system of claim 12, wherein the second slit structure extends in the second direction to divide the one word line pick-up structure into portions arranged along the first direction, and the first slit structure extends in the first direction to divide the one word line pick-up structure into portions arranged along the second direction.

* * * * *